US012596047B2

(12) United States Patent
Park et al.

(10) Patent No.: US 12,596,047 B2
(45) Date of Patent: Apr. 7, 2026

(54) DEVICE FOR SENSING LIQUID FLOWING INTO HOUSING OF ELECTRONIC CONTROL DEVICE

(71) Applicant: HL MANDO CORPORATION, Pyeongtaek-si (KR)

(72) Inventors: Chul Eui Park, Yongin-si (KR); Kyung Ran Cho, Seoul (KR)

(73) Assignee: HL MANDO CORPORATION, Pyeongtaek-si (KR)

( * ) Notice: Subject to any disclaimer, the term of this patent is extended or adjusted under 35 U.S.C. 154(b) by 347 days.

(21) Appl. No.: 18/024,134

(22) PCT Filed: Sep. 2, 2021

(86) PCT No.: PCT/KR2021/011897
§ 371 (c)(1),
(2) Date: Mar. 1, 2023

(87) PCT Pub. No.: WO2022/050741
PCT Pub. Date: Mar. 10, 2022

(65) Prior Publication Data
US 2023/0273086 A1      Aug. 31, 2023

(30) Foreign Application Priority Data

Sep. 2, 2020    (KR) ........................ 10-2020-0111604
Sep. 2, 2020    (KR) ........................ 10-2020-0111657

(51) Int. Cl.
*G01M 3/16*          (2006.01)
*B60T 13/68*          (2006.01)
(Continued)

(52) U.S. Cl.
CPC ............. *G01M 3/16* (2013.01); *B60T 13/686* (2013.01); *B60T 17/22* (2013.01); *H05K 7/1427* (2013.01)

(58) Field of Classification Search
CPC ........ B60T 8/368; B60T 13/686; G01M 3/16; H05K 5/0056; H05K 7/1427
See application file for complete search history.

(56) References Cited

U.S. PATENT DOCUMENTS 3,571,785 A * 3/1971 Kozicki ................. H01R 11/12
                                              439/730
11,348,440 B1 * 5/2022 Acosta .................... G01M 3/16
(Continued)

FOREIGN PATENT DOCUMENTS

CN            107531225 A      1/2018
CN            108778867 A      11/2018
(Continued)

OTHER PUBLICATIONS

Machine translation of KR 101693761, retrieved May 28, 2025 (Year: 2025).*
(Continued)

*Primary Examiner* — Bradley T King
(74) *Attorney, Agent, or Firm* — Harvest IP Law, LLP

(57)          ABSTRACT

A device for detecting a liquid introduced into a housing of an electronic control device is provided. The device for detecting a liquid introduced into a housing of an electronic control device according to an exemplary embodiment of the present disclosure is a device for detecting a liquid introduced into the housing of an electronic control device including a housing, a circuit board installed in the housing and an electronic controller mounted on one side of the circuit board and connected to an operator located outside the housing to control the operator, and the device may include a sensor which is formed on the other side of the circuit board; and a first switch for cutting off power supplied to the electronic controller from a power source, wherein the sensor includes a first electrode which is formed on the circuit board and a second electrode which is spaced (Continued)

apart from the first electrode by a predetermined distance, wherein the first electrode includes a linear first sensing pattern extending in a first direction, and wherein the second electrode includes a linear second sensing pattern extending in the first direction.

22 Claims, 16 Drawing Sheets

(51) Int. Cl.
    *B60T 17/22*       (2006.01)
    *H05K 7/14*        (2006.01)

(56)           References Cited

U.S. PATENT DOCUMENTS

| | | | |
|---|---|---|---|
| 2002/0017129 A1 | 2/2002 | Duff | |
| 2009/0001808 A1* | 1/2009 | Kodama | F15B 13/0842 |
| | | | 303/119.1 |
| 2011/0062775 A1 | 3/2011 | Lyatani | |
| 2014/0053545 A1* | 2/2014 | Yahagi | B60T 8/368 |
| | | | 60/545 |
| 2016/0229383 A1* | 8/2016 | Leiber | B60T 13/686 |
| 2018/0065609 A1* | 3/2018 | Leiber | B60T 13/745 |
| 2019/0100182 A1* | 4/2019 | Leiber | B60T 13/142 |
| 2023/0056076 A1* | 2/2023 | Becker | G01R 31/006 |
| 2024/0182014 A1* | 6/2024 | Zhang | B60T 11/16 |
| 2024/0369732 A1* | 11/2024 | Lee | H05K 7/1427 |

FOREIGN PATENT DOCUMENTS

| | | | |
|---|---|---|---|
| FR | 1502935 A | 10/1966 | |
| JP | 2015-125140 A | 7/2015 | |
| KR | 10-2006-0053687 A | 5/2006 | |
| KR | 10-1693761 B1 | 1/2017 | |
| KR | 10-2017-0119593 A | 10/2017 | |

OTHER PUBLICATIONS

Machine translation of KR 20170119593, retrieved May 28, 2025 (Year: 2025).*

International Search Report (PCT/ISA/210) issued in PCT Application No. PCT/KR2021/011897 dated Dec. 2, 2021 with English Translation.

Korean language Written Opinion (PCT/ISA/237) issued in PCT Application No. PCT/KR2021/011897 dated Dec. 2, 2021.

Office Action From Chinese Patent Office Dated Jan. 10, 2026 For Corresponding Chinese Patent Application.

\* cited by examiner

DEVICE FOR SENSING LIQUID FLOWING INTO HOUSING OF ELECTRONIC CONTROL DEVICE

CROSS-REFERENCE TO RELATED APPLICATION

This application is the U.S. National Phase under 35 U.S.C. § 371 of International Patent Application No. PCT/KR2021/011897, filed on Sep. 2, 2021, which claims priority to and the benefit of Korean Patent Application No. 10-2020-0111604, filed on Sep. 2, 2020, and Korean Patent Application No. 10-2020-0111657, filed on Sep. 2, 2020, the disclosures of which are incorporated herein by reference in their entirety.

TECHNICAL FIELD

The present disclosure relates to a device for detecting a liquid, and more specifically to a device for detecting a liquid introduced into a housing of an electronic control device.

BACKGROUND ART

The electronic control device refers to a device for controlling a mechanical device through an electronic circuit such as a transistor or an integrated circuit. Recently, as mechanical devices are widely developed in various fields, many electronic control devices for controlling mechanical devices have been used.

In many cases, such an electronic control device controls a mechanical device through a hydraulic cylinder. In particular, the main braking system of a vehicle generally uses a hydraulic brake.

The principle of operation of the main braking system of a vehicle is as follows. When the driver presses a brake pedal, the electronic control device detects this and opens or closes a cylinder valve to create a path for pressure to be transmitted to the brake pads, and uses a motor to transmit the hydraulic pressure of the brake oil inside the cylinder to each brake pad to generate a braking force. In this case, each valve and motor consumes current to generate a braking force.

Oil may leak from the cylinder due to an extended period of driving the vehicle or an external shock. In this case, the leaked oil MAY be introduced into the electronic control device for control ling a cylinder valve and a motor through the tube connected to the cylinder.

However, since it is necessary to secure an internal space in order to facilitate the design of a drive system when designing a vehicle, the electronic control device installed in the interior space of the vehicle is designed to be minimized. For example, one brake module may be configured by coupling the electronic control device to one side of a valve block for controlling the flow of brake oil.

In this case, since the circuit board inside the electronic control device is tightly fixed inside the electronic control device housing, oil can easily flow into the circuit board when oil is introduced into the electronic control device housing.

In particular, when oil is introduced into the housing of the electronic control device as described above, the oil moves in the self-weight direction under the influence of gravity and is accumulated at the lower side of the housing of the electronic control device in the direction of gravity, and there has been a problem in that the circuit board is damaged by causing an unexpected short circuit at the lower end of the circuit board.

In this case, if an electrical short circuit occurs in the circuit board on which the electronic controller is installed due to oil inflow, braking force may not be generated due to malfunction of the valve or motor, or overheating may occur in the electronic control device, which may lead to a fire in the vehicle. In particular, there has been a problem in that the driver cannot check in advance a malfunction or overheating due to oil inflow such that the user keeps driving the vehicle, which may lead to major accidents.

Therefore, conventional brake system manufacturers have been using methods such as preventing oil leakage through cylinder development, preventing a liquid from being introduced by sealing the electronic control device housing, performing water-proof treatment on the circuit board inside the electronic control device, or separately installing a liquid detection device to detect leaks. In addition, when an electrical short occurs due to the inflow of liquid, the power is cut off through a fuse or a thermal fuse.

However, the existing methods could not solve the problem due to inflow when a crack occurs in the cylinder due to long-term use or the performance of the waterproofing and sealing treatment is damaged. In addition, the method of separately installing a liquid detection device not only requires designing the interior space of the vehicle such that it does not affect the design of the vehicle's drive system but also requires a design change of the brake electronic control device itself, and there has been a problem in that the connection design is also required, which incurs cost.

In addition, the fuse opens only when a high current is generated due to an electrical short due to the inflow of liquid, and the thermal fuse operates only when high heat is generated continuously, and thus, there has been a problem in that it is not possible to respond in a timely manner.

DISCLOSURE

Technical Problem

The present disclosure is directed to providing a device for detecting a liquid introduced into a housing of an electronic control device and cutting off power supplied to the electronic controller without changing the design of a separate mechanical device or a conventional electronic control device housing, even in an environment where oil or moisture can enter the inside of the electronic control device housing, when controlling a mechanical device by using an electronic control device.

In addition, the present disclosure is directed to not only preventing fire caused by malfunction or overheating of a machine in advance, but also preventing permanent damage to a mechanical device due to fire, by notifying the user of the mechanical device that liquid has been introduced into the electronic control device such that the user can stop using the mechanical device.

In particular, the present disclosure is directed to preventing a driver's safety accident by notifying the driver of a dangerous situation before malfunction or overheating occurs, and preventing major accidents due to malfunction or overheating by cutting off the power in case of emergency, even if an unexpected electrical short occurs in the brake system of a vehicle that controls the brake by using a hydraulic cylinder due to oil inflow to a circuit inside the electronic control device while the driver is driving the vehicle.

The problems of the present disclosure are not limited to the problems mentioned above, and other problems not mentioned will be clearly understood by those skilled in the art from the description below.

Technical Solution

In order to solve the above problems, the device for detecting a liquid introduced into a housing of an electronic control device according to an aspect of the present disclosure is a device for detecting a liquid introduced into the housing of an electronic control device, which includes a housing, a circuit board installed in the housing and an electronic controller mounted on one side of the circuit board and connected to an operator located outside the housing to control the operator, and the device includes a sensor which is formed on the other side of the circuit board; and a first switch for cutting off power supplied to the electronic controller from a power source, wherein the sensor includes a first electrode which is formed on the circuit board and a second electrode which is spaced apart from the first electrode by a predetermined distance, wherein the first electrode includes a linear first sensing pattern extending in a first direction, wherein the second electrode includes a linear second sensing pattern extending in the first direction, wherein the first sensing pattern and the second sensing pattern are arranged in parallel, and wherein the electronic controller includes a first calculator for calculating a resistance formed between the first sensing pattern and the second sensing pattern by a liquid introduced into the housing, and operates the first switch according to a value measured by the first calculator to cut off the supplied power.

In this case, the first direction may be a direction extending along an edge of the circuit board.

In this case, the first electrode may further include a first connection pattern extending in a second direction, wherein the first sensing pattern may extend from the first connection pattern in the first direction, wherein the second electrode may further include a second connection pattern extending in the second direction, and wherein the second sensing pattern may extend from the second connection pattern in the first direction.

In this case, the first connection pattern and the second connection pattern may be formed inside the circuit board, and wherein the first sensing pattern and the second sensing pattern may be formed on one surface of the circuit board so as to be exposed to the outside.

In this case, the device may further include a third electrode which is formed on a side of the second electrode, wherein the third electrode may include a linear third sensing pattern extending in the first direction, wherein the first sensing pattern, the second sensing pattern and the third sensing pattern may be arranged in parallel, and wherein the electronic controller may further include a second calculator for calculating a resistance formed between the first sensing pattern and the third sensing pattern.

In this case, the third electrode may further include a third connection pattern extending in a second direction, and wherein the third sensing pattern may extend from the third connection pattern in the first direction.

In this case, the first direction may be a direction perpendicular to a direction extending along an edge of the circuit board.

In this case, the first sensing pattern may be formed in plurality and a plurality of the first sensing patterns may be arranged parallel to each other, wherein the second sensing pattern may be formed in plurality, and a plurality of the second sensing patterns may be arranged parallel to each other, and wherein the plurality of the first sensing patterns and the plurality of the second sensing patterns may be alternately disposed.

In this case, the electronic controller may operate the first switch to cut off the supplied power, when the first calculator measures a resistance formed between the first sensing pattern and the second sending pattern.

In this case, the electronic controller may operate the first switch to cut off the supplied power, when the resistance formed between the first sensing pattern and the second sensing pattern measured by the first calculator exceeds a predetermined value.

In this case, the device may further include a third electrode which is formed on a side of the second electrode, wherein the third electrode may include a plurality of third sensing patterns extending in the first direction and arranged parallel to each other, wherein the plurality of the third sensing patterns may be arranged to alternate with some of the plurality of the first sensing patterns, and wherein the electronic controller may further include a second calculator for calculating a resistance formed between the third sensing pattern and the first sensing pattern.

In this case, the third electrode may further include a third connection pattern extending in a second direction, and wherein the third sensing pattern may extend from the third connection pattern in the first direction.

In this case, the device may further include a third electrode which is formed on a side of the second electrode, wherein the third electrode may include a third connection pattern extending in a second direction; and a plurality of third sensing patterns extending in the first direction from the third connection pattern and arranged parallel to each other, wherein the plurality of the third sensing patterns may be arranged to alternate with the plurality of the first sensing patterns and the plurality of the second sensing patterns in order, and wherein the electronic controller may further include a second calculator for calculating a resistance formed between the third sensing pattern and the first sensing pattern.

In this case, the electronic controller may measure a resistance formed between the first sensing pattern and the second sensing pattern by the first calculator, and measure a resistance formed between the third sensing pattern and the first sensing pattern by the second calculator.

In this case, the electronic controller may operate the first switch to cut off the supplied power, when the resistance formed between the first sensing pattern and the second sensing pattern measured by the first calculator exceeds a predetermined value, or the resistance formed between the third sensing pattern and the first sensing pattern measured by the second calculator exceeds a predetermined value.

In this case, the first electrode and the second electrode may be connected in parallel to each other.

In this case, the first electrode and the second electrode may be arranged in a line with each other.

In this case, the first electrode and the second electrode may be arranged perpendicular to each other.

In this case, the sensor may be formed on a periphery or corner of the circuit board.

In this case, the sensor may be formed in plurality, and wherein a plurality of the sensors may be formed at different positions on the circuit board.

In this case, wherein the electronic controller may include a main electronic controller; an operator controller for receiving a signal from the main electronic controller to control an operator; and a second switch for cutting off power supplied from the power source to the operator controller, and wherein the main electronic controller may determine whether a liquid is introduced into the housing through a resistance change of the sensor and operate the second switch to cut off power supplied to the operator controller.

In this case, the circuit board may be disposed inside the housing such that the sensor is formed at a lower end with respect to the self-weight direction.

In this case, the circuit board may be installed inside the housing so as to be parallel to the self-weight direction.

In this case, the housing may include a first housing and a second housing coupled to the first housing to form a space therein, wherein the circuit board may be disposed inside the first housing and the second housing such that the sensor is adjacent to an edge in which the first housing and the second housing come into contact with each other.

In this case, the operator may be a brake system of a vehicle that is controlled by using brake oil, and wherein the liquid may be the brake oil leaked from a brake system of the vehicle and introduced into the housing.

In this case, the brake system of the vehicle may include a reservoir in which the brake oil is stored; a valve block having the reservoir connected to one side and having at least one flow path formed therein such that the brake oil moves; and at least one solenoid valve for opening and closing the flow path formed in the valve block, wherein the housing may be fixed to the other side of the valve block, and wherein the electronic controller may control the opening and closing of the solenoid valve.

In this case, the sensor may be disposed on one surface of the circuit board on a side on which the valve block is disposed.

Advantageous Effects

The device for detecting a liquid for detecting a liquid introduced into a housing of an electronic control device according to an exemplary embodiment of the present disclosure can detect a liquid introduced into a housing of an electronic control device and cut off power supplied to the electronic controller without changing the design of a separate mechanical device or a conventional electronic control device housing through a design change of a circuit board inside the electronic control device.

In addition, the device for detecting a liquid for detecting a liquid introduced into a housing of an electronic control device according to an exemplary embodiment of the present disclosure is compatible with various mechanical devices because there is no change in the design of the conventional mechanical device itself, and since the sensor can be provided only by printing on a printed circuit board or engraving an insulating layer, the manufacturing cost can be reduced.

In addition, the device for detecting a liquid for detecting liquid introduced into the housing of the electronic control device according to an exemplary embodiment of the present disclosure can detect whether the liquid has been introduced into the housing by designing the position and number of sensors to be different depending on the direction in which the liquid is introduced into the housing of the electronic control device.

Furthermore, the device for detecting a liquid for detecting a liquid introduced into the housing of the electronic control device according to an exemplary embodiment of the present disclosure notifies the user of the fact that the liquid has been introduced into the electronic control device through an alarm unit such that the user can stop the use of mechanical devices, and thus, it is possible not only to prevent fire caused by machine malfunctions or overheating in advance, but also to prevent permanent damage to mechanical devices due to fire.

In particular, the device for detecting a liquid for detecting a liquid introduced into the housing of the electronic control device according to an exemplary embodiment of the present disclosure can be used in a brake system of a vehicle that controls the brake by using a hydraulic cylinder, and may prevent personal injury caused by accidents while driving the vehicle.

MODES OF THE INVENTION

Figure 1:
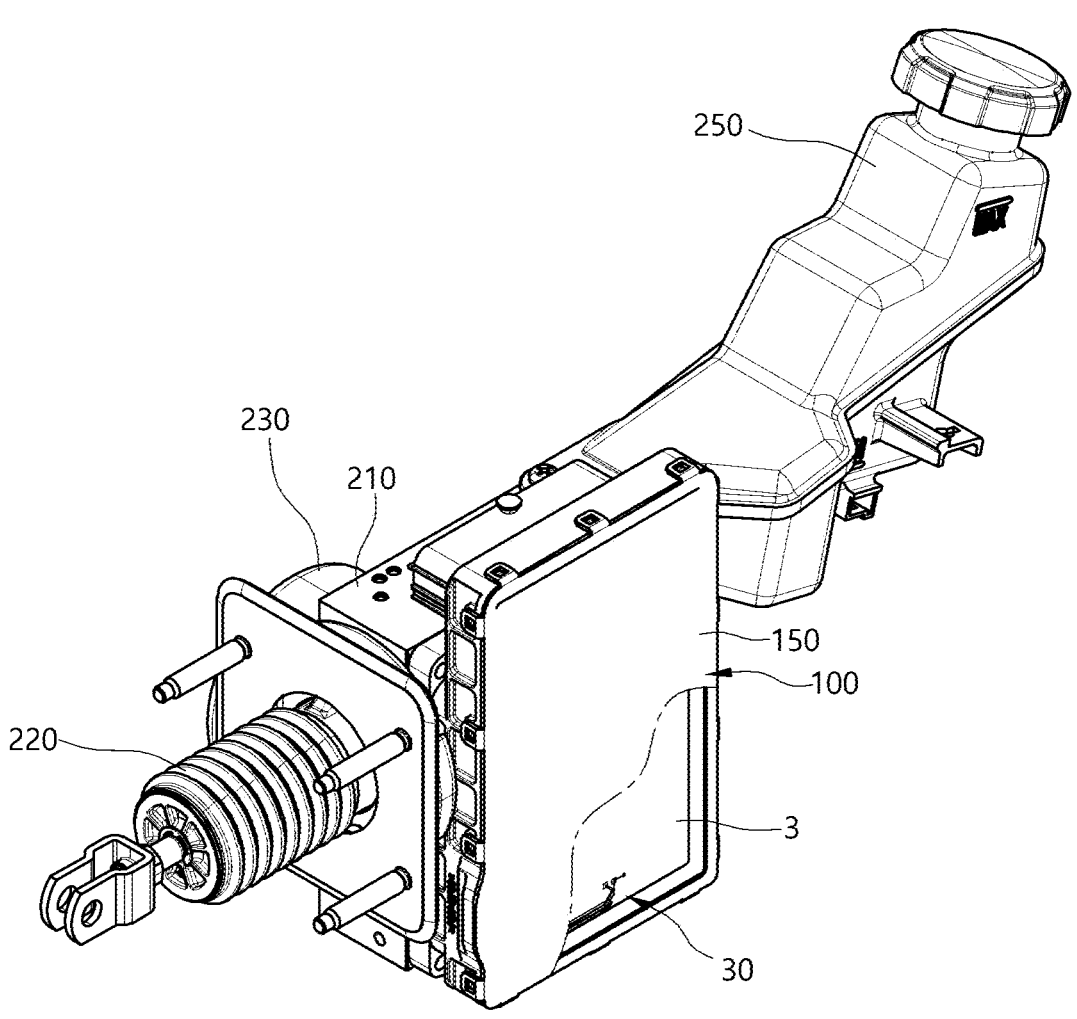
FIG. 1 is a rear perspective view of the electronic control device of a brake system provided with the device for detecting a liquid according to a first example of the present disclosure.

Hereinafter, the exemplary embodiments of the present disclosure will be described in detail with reference to the accompanying drawings so that those of ordinary skill in the art to which the present disclosure pertains can easily practice the present disclosure. The present disclosure may be embodied in many different forms and is not limited to the exemplary embodiments described herein. In order to clearly describe the present disclosure in the drawings, parts irrelevant to the description are omitted, and the same reference numerals are assigned to the same or similar components throughout the specification.

When a liquid introduced into a housing of an electronic control device is located between a first electrode and a second electrode formed with a predetermined interval on the circuit board such that the first electrode and the second electrode are energized, the present disclosure provides a device in which an electronic controller detects this to cut off the supplied power.

In particular, as a first example of the present disclosure, the device for detecting a liquid may be installed inside a housing of an electronic control device constituting a brake system of a vehicle. Hereinafter, before describing the device for detecting a liquid according to the present disclosure, a vehicle brake system in which the device for detecting a liquid of the present disclosure is installed will be described, and then, the device for detecting a liquid installed in the vehicle brake system will be described.

FIG. 1 is a rear perspective view of the electronic control device of a brake system provided with the device for detecting a liquid according to a first example of the present disclosure.

Referring to FIG. 1, a brake system 200 provided with the device for detecting a liquid according to various examples of the present disclosure includes a valve block 210, a pedal simulator 220, a master cylinder (not illustrated), a motor 230, a pump 240, a reservoir 250 and a brake system electronic control device 100.

In this case, when the user steps on a brake pedal (not illustrated) connected to one end of the pedal simulator 220, the pedal simulator 220 provides a reaction force according to the displacement of the brake pedal (not illustrated).

The pedal simulator 220 includes a reaction force piston (not illustrated) and a reaction force spring (not illustrated) installed inside a chamber formed in the valve block 210, and the longitudinal central axis thereof is disposed on the front part of a master cylinder (not illustrated) so as to be located on the same line with the longitudinal direction central axis of the master cylinder (not illustrated).

In this case, the master cylinder (not illustrated) is a device that converts a pedal force of the brake pedal (not illustrated) into a constant braking pressure required for braking and supplies it to a wheel cylinder (not illustrated).

When the driver steps on the brake pedal, the working fluid (brake oil) inside the pressure chamber of the master cylinder (not illustrated) is supplied to the chamber of the pedal simulator 220 to move the reaction force piston inside the chamber and elastically compress the reaction force spring, and when the pedal force applied to the brake pedal is released, the reaction force piston moves in the opposite direction by the elastic repulsive force of the reaction force spring to provide a reaction force, thereby providing an appropriate pedal feeling to the driver.

In this case, a reservoir 250 in which the brake oil supplied to each pressure chamber of the master cylinder (not illustrated) is stored is coupled to one side portion of the valve block 210 in which the master cylinder (not illustrated) is located.

The valve block 210 is provided with a reservoir 250, a master cylinder (not illustrated) and a flow path respectively connected to the pedal simulator 220 therein, and a plurality of solenoid valves for opening and closing the flow of brake oil moving to the reservoir 250, the master cylinder (not illustrated) and the pedal simulator 220 are provided on the flow path.

That is, a plurality of solenoid valves required for operating the anti-lock braking system (ABS) and electronic stability control (ESC) are mounted on the valve block 210, and each of the solenoid valves is operated by an electric signal which is input from the brake system electronic control device 100 to control the flow of brake oil.

Meanwhile, a motor 230 is provided on one side of the valve block 210 separately from the master cylinder (not illustrated) and the pedal simulator 220. A pump 240 disposed inside the valve block 210 is connected to the motor 230, and the pump 240 is driven by the motor 230 to generate additional braking pressure.

The pump 240 drives internal pump pistons forward and backward through the motor 230 and generates a braking pressure required for braking wheels (not illustrated) according to the intake amount and speed of the brake pedal sensed by a pedal displacement sensor (not illustrated) installed in the brake system electronic control device 100 to be described below.

Referring to FIG. 1, the brake system electronic control device 100 equipped with the device for detecting a liquid according to various examples of the present disclosure includes an electronic control device housing 150 and an electronic control device controller (not illustrated). The electronic control device controller is disposed in a space formed inside the electronic control device housing 150.

The electronic control device controller includes a circuit board 3 on which a first MCU (not illustrated) is mounted. More specifically, the first MCU may be mounted on a plate-shaped circuit board 3 formed in a rectangular shape. In this case, the shape of the circuit board 3 may be formed in various shapes according to the space in the vehicle in which the brake system 200 is accommodated, and there is no limitation in the examples.

The first MCU receives the signals sensed from the master cylinder (not illustrated), pressure sensors (not illustrated) for respectively sensing the pressure inside the pedal simulator 220, and a pedal displacement sensor (not illustrated) to control the motor 230 and each of the solenoid valves inside the valve block 210.

In addition, the brake system electronic control device 100 may be provided with a control coil for controlling the solenoid valve inside the valve block 210 and a motor position sensor (not illustrated) for detecting the position of the rotor of the motor 230.

In this case, as illustrated in FIG. 1, the circuit board 3 provided with the electronic control device controller may be provided with a configuration for detecting liquid inflow of the device for detecting a liquid according to a first example of the present disclosure. That is, the brake system electronic control device 100 including the electronic control device controller may be the device for detecting a liquid according to various examples of the present disclosure.

Accordingly, when a fluid, for example, brake oil, is introduced into the electronic control device controller from the outside, the electric power supplied to the electronic control device controller is cut off, thereby preventing a fire in the vehicle.

In particular, as illustrated in FIG. 1, the electronic control device housing 150 is coupled to one side surface of the valve block 210. This is to secure the space inside the vehicle by making the overall size of the brake system small. However, as the electronic control device housing 150 is disposed to be close to the valve block 210, there is a problem in that brake oil flowing out from the valve block 210 may be introduced into the electronic control device housing 150.

Hereinafter, the device for detecting a liquid 6 included in the above-described brake system 200 will be described in detail with reference to the drawings. In this case, for the convenience of description, the drawings are illustrated briefly enough to explain the flow of current, and do not reflect the actual shape or size.

Figure 2:
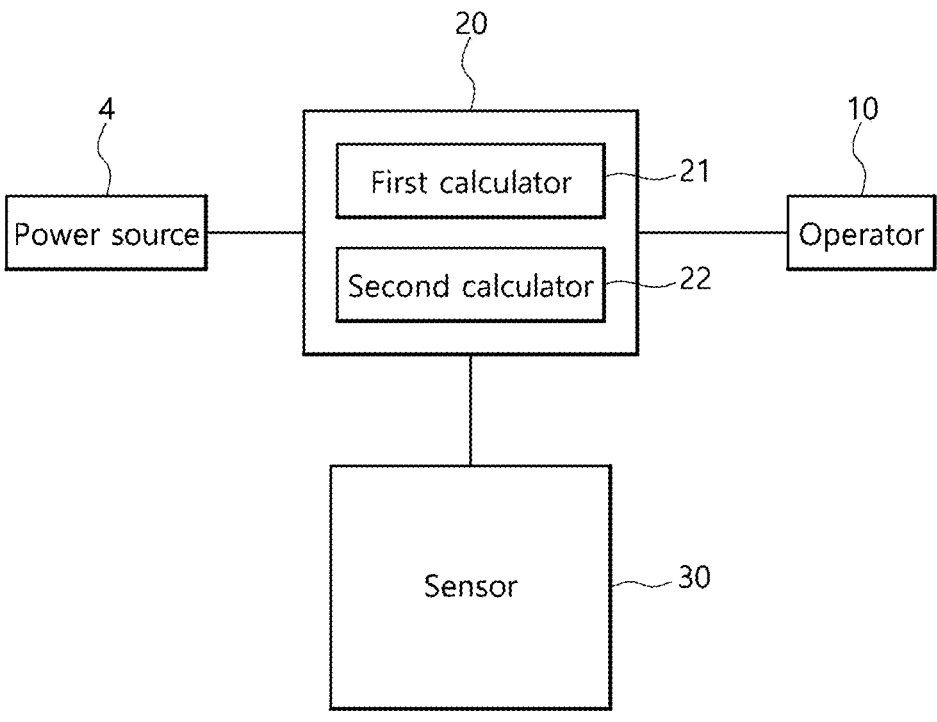
FIG. 2 is a diagram schematically showing the configuration of the device for detecting a liquid according to the first example of the present disclosure.
Figure 3:
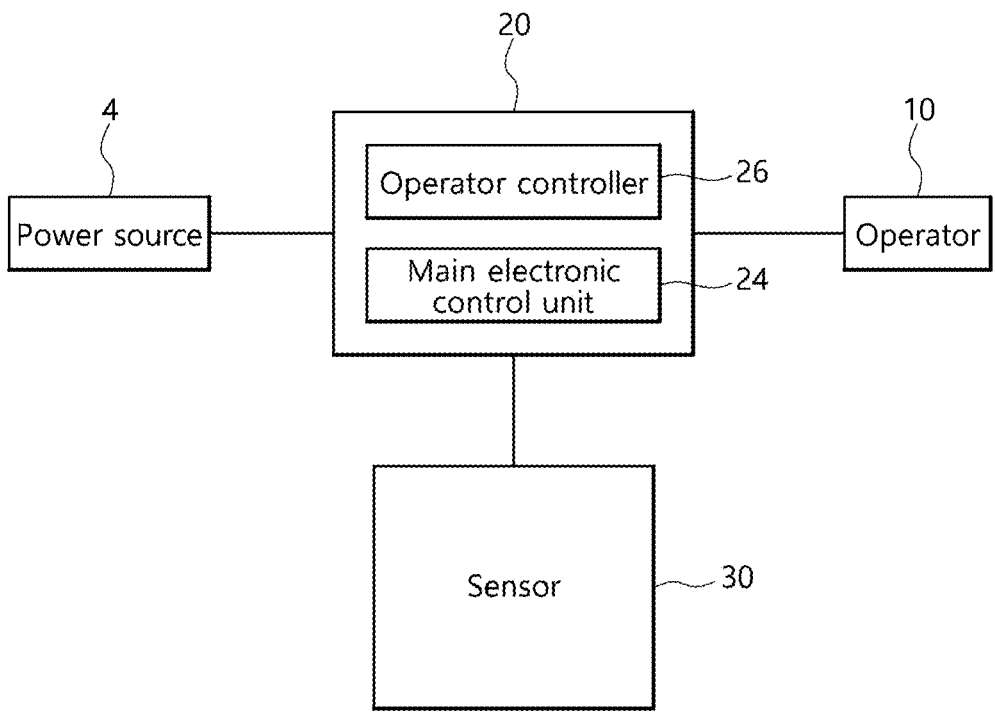
FIG. 3 is a diagram schematically showing the configuration of the device for detecting a liquid according to the first example of the present disclosure.
Figure 4:
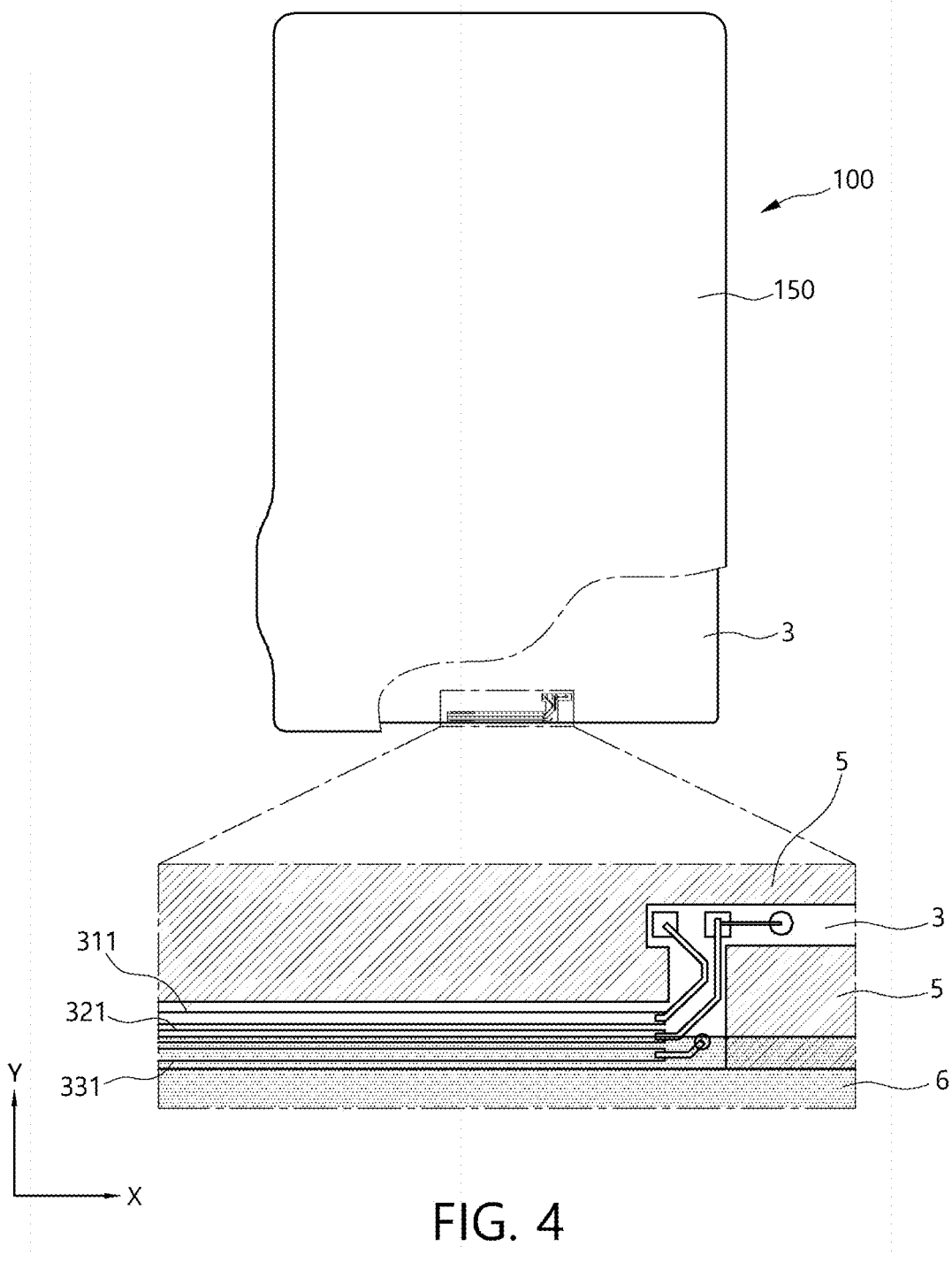
FIG. 4 is a plan view in which the first electrode, the second electrode and the third electrode are disposed on a circuit board of the device for detecting a liquid according to the first example of the present disclosure.
Figure 5:
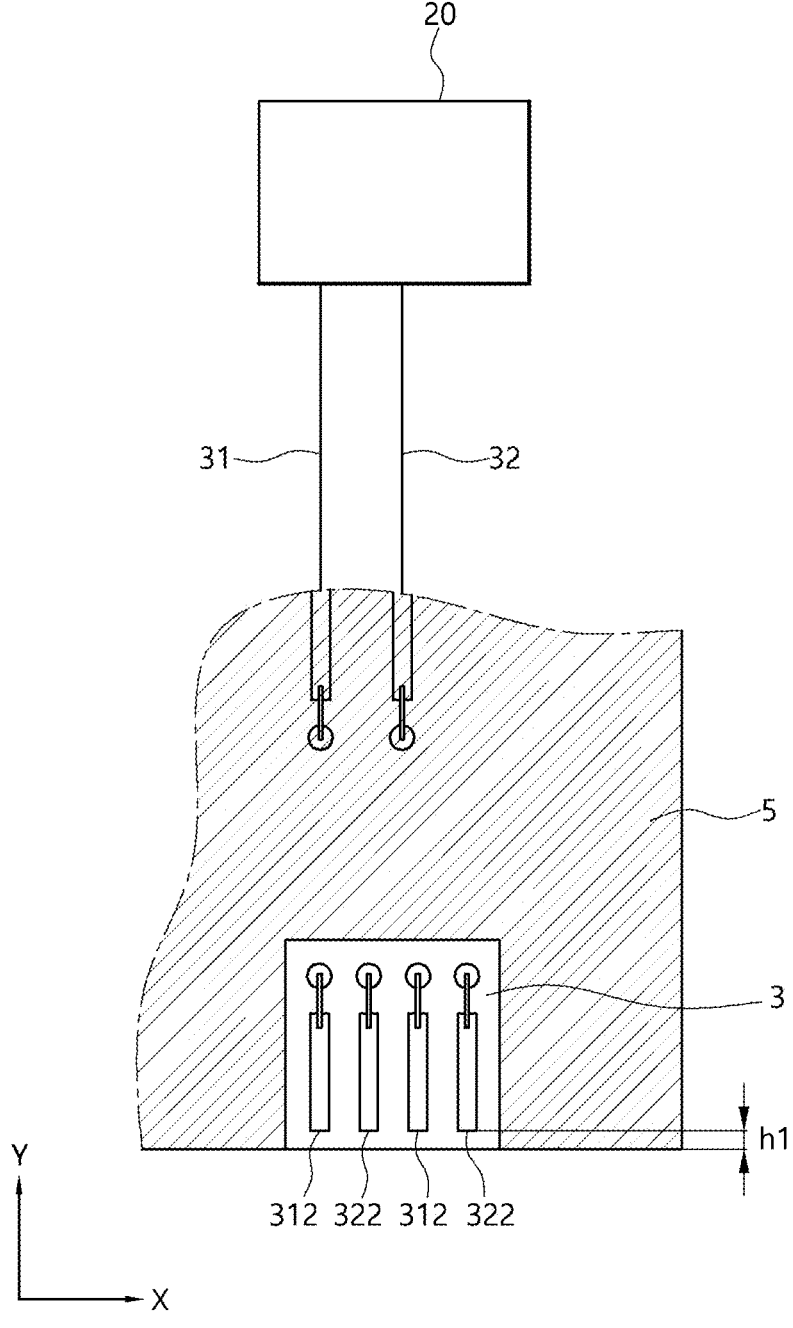
FIG. 5 is a plan view in which the first electrode and the second electrode of the device for detecting a liquid according to a second example of the present disclosure are disposed on a circuit board.

FIG. 4 is a plan view in which the first electrode, the second electrode and the third electrode are disposed on a circuit board of the device for detecting a liquid according to the first example of the present disclosure. FIG. 2 is a diagram schematically showing the configuration of the device for detecting a liquid according to the first example of the present disclosure, FIG. 3 is a diagram schematically showing the configuration of the device for detecting a liquid according to the first example of the present disclosure, and FIG. 5 is a plan view in which the first electrode and the second electrode of the device for detecting a liquid according to a second example of the present disclosure are disposed on a circuit board.

Hereinafter, the second direction and the first direction refer to directions that do not coincide with each other, and the angle between the second direction and the first direction may vary depending on the shape of the circuit board or the shape of an element mounted on the circuit board. However, in the following description, for convenience, the angle formed by the second direction and the first direction is defined as being perpendicular. In addition, the second direction and the first direction may be an X-axis direction or a Y-axis direction, respectively, according to various examples.

Referring to FIG. 2, the device for detecting a liquid 6 introduced into a housing of an electronic control device according to the first example of the present disclosure is connected to an operator 10 located outside the housing 2, and includes a sensor 30 as the electronic control device in which the electronic controller 20 for controlling the operator 10 is mounted on one side of the circuit board 3 installed inside the housing 2.

In this case, the housing 2 is installed in the internal space of a mechanical device provided with the operator 10 to be controlled, and the circuit board 3 installed inside the housing 2 is fixed and protected. The operator 10 to be controlled may be a brake hydraulic cylinder valve or a motor of a vehicle.

The shape or form of the housing 2 may be designed and modified according to the internal structure of a mechanical device, for example, a vehicle. In particular, the housing 2 is manufactured in a minimized form so as not to affect the driving system of the vehicle.

The housing 2 serves to protect the circuit board 3 by blocking foreign substances such as dust and liquid from being introduced into the housing 2 from the outside. However, since the housing 2 is installed inside the vehicle and does not receive a direct impact from the outside, it may be generally made of a plastic material.

The housing 2 is manufactured in a form that can be opened for repair when the electronic control device fails, and may be manufactured in a form that can be assembled. Accordingly, the housing 2 may include an opening/closing part (not illustrated) for opening or an assembly space (not illustrated).

The arrangement or orientation in which the housing 2 is fixed inside the mechanical device is not limited to a particular arrangement or orientation. However, since the liquid 6 may be introduced into the housing 2, the housing 2 may be installed inside the mechanical device such that an opening/closing part (not illustrated) for opening the housing 2 or an assembly space (not illustrated) is located is located in the opposite direction to the inflow direction of the liquid 6 expected to be introduced into the housing 2.

Meanwhile, the circuit board 3 which is protected from the outside through the housing 2 is installed and fixed inside the housing 2. In this case, the circuit board 3 means a generally used printed circuit board (PCB) and is not limited to being made of a specific material.

The shape or direction in which the circuit board 3 is fixed inside the housing 2 is not limited to a specific shape or direction. However, when the liquid 6 is introduced into the housing 2, the liquid 6 moves along the inner surface of the housing 2 in the self-weight direction, and thus, in order to minimize damage to the circuit board 3 due to a short circuit due to contact with the liquid 6, it may be disposed to have a predetermined angle with a direction perpendicular to the self-weight direction.

In this case, the electronic controller 20 is connected and fixed to a conductive wire printed on the circuit board 3, and if the electronic controller 20 can operate by receiving power from a power source 4, there is no limitation on the position to be connected on the circuit board 3.

However, in order to protect the electronic controller 20 from the liquid 6 introduced into the housing 2, it is preferable that the electronic controller 20 is located in a direction opposite to the direction in which the opening/closing part (not illustrated) for opening the housing 2 or the assembly space (not illustrated) is located.

Meanwhile, as shown in FIG. 2, the device for detecting a liquid 6 according to the first example of the present disclosure includes a first switch (not illustrated) between the electronic controller 20 and the power source 4 so as to block the power supplied from the power source 4.

In this case, the first switch may be a semiconductor device for power, for example, a transistor, but there is no limitation in the examples as long as the power supplied from the power source 4 to the electronic controller 20 can be cut off by operating the first switch.

In this case, when a liquid is introduced into the housing 2, the electronic controller 20 may control the first switch to cut off the power supplied from the power source 4. That is, the electronic controller 20 may cut off the power supplied to itself, and when the power supplied to the electronic controller 20 is cut off, the electronic controller 20 may not participate in controlling the operator 10.

In addition, the electronic controller 20 detects a change in resistance due to contact with the liquid 6 to notify the user that a liquid has been introduced through an alarm unit (not illustrated) before cutting off the supplied power, if the resistance due to the liquid detected by a sensor 30 to be described below for determining the presence or absence of the liquid exceeds a set value, and the user may be notified in advance that the power is to be cut off later. Therefore, since the user can stop using the mechanical device at an early stage by himself/herself, an accident caused by a malfunction of the mechanical device may be prevented in advance, and permanent failure of the mechanical device may be prevented.

In this case, the method by which the electronic controller 20 notifies the user of the inflow of the liquid 6 through the alarm unit (not illustrated) may be a method of visually notifying such as blinking a warning light through the instrument panel, or a method of aurally notifying such as sounding a warning sound through a speaker.

Meanwhile, referring to FIG. 3, the electronic controller 20 of the device for detecting a liquid 6 according to the first example of the present disclosure may include a main electronic controller 24, an operator controller 26 and a second switch (not illustrated).

In this case, the main electronic controller 24 may send a signal for controlling the operator 10 to the operator controller 26, and the operator controller 26 receives the signal and to control the operation of the operator 10.

The main electronic controller 24 and the operator controller 26 may be configured to be functionally divided within one piece of hardware, or may be configured to be divided into separate pieces of hardware.

Meanwhile, the operator controller 26 uses high power to control the operator 10. Therefore, in most cases where a fire occurs due to the liquid 6 inside the housing 2, an unexpected short circuit occurs due to the inflow of the liquid 6 to a circuit associated with the operator controller 26, resulting in many cases of fire occurring.

Therefore, when the main electronic controller 24 detects the inflow of the liquid 6 through a resistance change of the sensor 30 as shown in FIG. 3, it is possible to prevent a fire from occurring by operating a second switch (not illustrated) to cut off the power supplied from the power source 4 to the operator controller 26.

In this case, the second switch (not illustrated) may be a semiconductor device for power, for example, a transistor, like the first switch (not illustrated), but there is no limitation in the examples as long as the main electronic controller 24 can operate the second switch (not illustrated) to cut off the power supplied from the power source 4 to the operator controller 26.

Accordingly, whereas the power supplied to the operator controller 26 is cut off, the power supplied to the main electronic controller 24 is not cut off, thus, there is an advantage that an alarm unit (not illustrated) that provides a warning alarm to other device, for example, the user, may be electronically controlled while preventing the risk of fire.

However, even if the main electronic controller 24 can cut off the power supplied to the operator controller 26, as shown in FIG. 3, the main electronic controller 24 may cut off the power supplied to the electronic controller 20 including the magnetic field so as to more reliably prevent fire or failure, and if the power supplied to the electronic controller 20 is cut off, the electronic controller 20 may not be involved in device control.

Meanwhile, the sensor 30 that sends a signal for determining whether the power supplied to the electronic controller 20 is cut off includes a first electrode 31 and a second electrode 32 formed on the circuit board 3 while being spaced apart from each other so as to be energized by the liquid introduced into the housing 2.

In this case, the sensor 30 including the first electrode 31 and the second electrode 32 is electrically short-circuited by the liquid 6 introduced into the housing 2 to detect current, and transmits the sensed signal to the electronic controller 20.

In this case, the electronic controller 20 is connected and fixed to the first electrode 31 and the second electrode 32 on the circuit board 3.

In the electronic controller 20 to which the first electrode 31 and the second electrode 32 are connected, the liquid 6 introduced into the housing 2 is located between the first electrode 31 and the second electrode 32 to cut off the power supplied according to the resistance generated by the energization of the first electrode 31 and the second electrode 32.

Meanwhile, as can be seen with reference to FIGS. 2 and 4, according to the first example of the present disclosure, the sensor 30 that detects the inflow of the liquid 6 and sends a signal to the electronic controller 20 is disposed on the circuit board 3.

In this case, the sensor 30 is not installed as a separate device, but is integrally formed on the circuit board 3, and there is no limitation in the examples as long as it can be energized by the self-resistance of the liquid 6 introduced into the housing 2.

For example, when the method of forming the sensor 30 is described, the sensor 30 may be formed in such a way that it prints a pattern according to various examples to be described below on a circuit board and covers the insulating layer 5 to protect the circuit, and does not cover the insulating layer on the pattern. In addition, the conductive pad and the insulating layer may be disposed on the circuit board to have the layers in order, and the insulating layer may be formed in such a way that it is engraved according to the pattern such that the conductive pad is exposed to the outside according to the pattern to be described below.

In this case, the material of the sensor 30 may be the same material as the conductive wire printed on the circuit board 3, and copper (Cu) is preferably used to prevent power loss due to the inherent resistance of the material. However, the material is not limited as long as it is a material having electrical conductivity through which current flows.

According to the first example of the present disclosure with reference to FIG. 4, the sensor 30 is formed on the periphery or corner of the lower portion of the circuit board 3. Disposing the sensor 30 at the periphery or corner of the circuit board 3 has an advantage that the sensor 30 may be configured to detect the fluid before the liquid 6 is introduced into the housing 2 and flows into the electronic controller 20 installed on the circuit board 3.

In particular, the housing 2 may include a first housing and a second housing that are coupled to provide a space in which the circuit board 3 can be disposed. In this case, between the first housing and the second housing, an edge portion is formed to come into contact while the first housing and the second housing are coupled. In this case, when the liquid 6 is introduced from the outside of the housing 2, the liquid 6 is introduced through the edge portion where the first housing and the second housing come into contact with each other by coupling. Accordingly, the sensor 30 may be disposed inside the housing 2 so as to be adjacent to the edge portions of the first housing and the second housing.

In addition, the liquid 6 introduced into the housing 2 moves in the self-weight direction by gravity. Accordingly, the liquid 6 introduced into the housing 2 is accumulated at the lower end of the inside of the housing 2 based on the direction of gravity. In this case, as the liquid 6 is accumulated, the liquid 6 comes into contact with the lower end of the circuit board 3, thereby causing an unexpected short circuit, and thus, the circuit board 3 may be damaged, and therefore, the sensor 30 is formed at the lower end of the circuit board 3 based on the self-weight direction such that it may contact the accumulated liquid 6 first.

Meanwhile, the interval between the first electrode 31 and the second electrode 32 provided in the sensor 30 may vary depending on the type of the liquid 6 that is expected to be introduced. In particular, when the liquid expected to be introduced is a liquid having a large surface tension, the liquid may not spread on the circuit board 3, and thus, the gap between the first electrode 31 and the second electrode 32 must be formed to be narrowed.

Referring to FIG. 4, the first electrode 31 and the second electrode 32 of the device for detecting a liquid according to the first example of the present disclosure are spaced apart from each other and disposed in parallel. In this case, when the first electrode 31 and the second electrode 32 are examined in more detail, the first electrode 31 is formed a first connection pattern 311 and a first sensing pattern 312 in a direction of extending along the edge portion of the circuit board 3 along the Y axis of FIG. 4. In the first example of the present disclosure, the Y-axis direction is defined as a second direction, and the X-axis direction is defined as a first direction.

In this case, the first connection pattern 311 and the second connection pattern 321 do not necessarily have to be formed parallel to the second direction, and as illustrated in FIG. 4, the extending direction ultimately means being toward the second direction.

The first sensing pattern 312 and the second sensing pattern 322 extend in the first direction from the first connection pattern 311 and the second connection pattern 321, respectively, and are disposed parallel to each other.

Meanwhile, in the first example of the present disclosure, as illustrated in FIG. 4, a third electrode 33 may be further provided, and the third electrode 33 is formed with a third connection pattern 331 disposed on one side of the connection pattern 321 and the second connection pattern 321 in the second direction. A third sensing pattern 332 is formed to extend from the third connection pattern 331 in the first direction, and the third sensing pattern 332 is disposed to be parallel together with the first sensing pattern 312 and the second sensing pattern 322.

In this case, the first electrode 31, the second electrode 32 and the third electrode 33 in the first example of the present disclosure differ from other examples described below only in the formation of a pattern, and since the principle of detecting the liquid 6 through the first electrode 31, the second electrode 32 and the third electrode 33 is the same, the description thereof will be provided in detail together with the second example of the present disclosure, after the shapes of the first electrode 31 and the second electrode 32 of the second example are described.

Referring to FIG. 5, the first electrode 31 and the second electrode 32 of the device for detecting a liquid according to the second example of the present disclosure are formed in a comb pattern on the circuit board 3 while being spaced from each other. In this case, in FIG. 5, the X-axis direction is defined as a second direction and the Y-axis direction is defined as a first direction.

The first electrode 31 and the second electrode 32 formed in the comb pattern illustrated in FIG. 5 will be described in more detail as follows. The first electrode 31 includes a first connection pattern 311 that is linearly formed on the circuit board 3 in an arbitrarily set second direction, and a plurality of first sensing patterns 312 that are arranged parallel to each other by extending from the first connection pattern 311 in a first direction perpendicular to the second direction. The second electrode 32 includes a second connection pattern 321 that is linearly formed on the circuit board 3 in the second direction, and a plurality of second sensing patterns that are arranged parallel to each other by extending from the second connection pattern 321 in the first direction. In this case, the plurality of first sensing patterns 312 and the plurality of second sensing patterns 322 are alternately arranged, that is, arranged to be alternately adjacent to each other in the order of the first sensing pattern 312 and the second sensing pattern 322.

In this case, the first connection pattern 311 and the second connection pattern 321 may be formed inside the circuit board 3 if not exposed to the outside as shown in FIG. 5.

The plurality of first sensing patterns 312 and the plurality of second sensing patterns 322 that are alternately arranged are arranged to have a predetermined distance (h1) from the edge of the circuit board 3. In this case, it is preferable to minimize the gap (h1) to dispose the plurality of first sensing patterns 312 and the plurality of second sensing patterns 322 such that the sensor 30 may quickly detect a change in resistance caused by the liquid 6 introduced into the housing 2 from the outside. In this case, as in the second example of the present disclosure, if the direction of the first sensing pattern 312 and the second sensing pattern 322 is formed to extend toward the edge or the periphery of the circuit, there is an advantage that it is easy to manufacture by minimizing the gap (h1).

In this case, as illustrated in FIG. 5, a rectangular pattern may be formed on the peripheral portion or the edge side end of the circuit board 3 of the first detection pattern 312 and the second detection pattern 322. In addition, the insulating layer 5 may be formed up to the upper end of the rectangular pattern so as to expose only the rectangular pattern to the outside.

Meanwhile, in various examples to be described below, as illustrated in FIGS. 4 and 5, it is apparent that a rectangular pattern may be formed at the end of the pattern for detecting the inflow of liquid, that is, at the periphery or corner side end of the circuit board 3.

Figure 6:
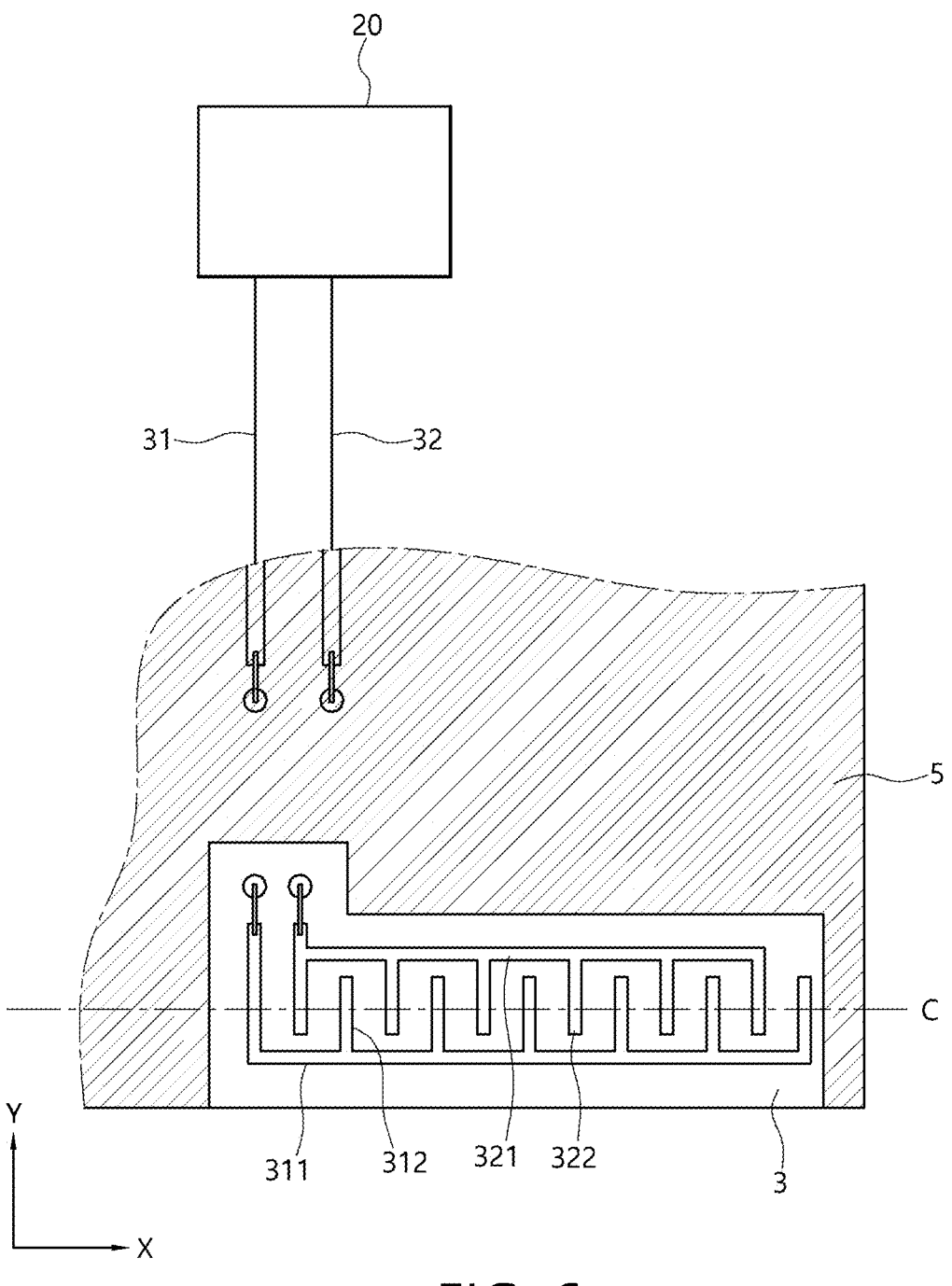
FIG. 6 is a plan view in which the first to third electrodes of the device for detecting a liquid according to a modified example of the second example of the present disclosure are disposed on a circuit board.

FIG. 6 is a plan view in which the first electrode and the second electrode of the device for detecting a liquid according to a modified example of the second example of the present disclosure are disposed on a circuit board.

The first electrode 31 and the second electrode 32 of the device for detecting a liquid 6 according to the example of the modified example of the second example of the present disclosure are formed in a comb pattern on the circuit board 3 while being spaced apart from each other. The first electrode 31 and the second electrode 32 formed in the comb pattern as illustrated in FIG. 6 will be described in more detail as follows. The first electrode 31 includes a first connection pattern 311 that is formed linearly on the circuit board 3 in an arbitrarily set second direction, and a plurality of first sensing patterns 312 that are arranged in parallel with each other by extending from the first connection pattern 311 in a first direction perpendicular to the second direction. The second electrode 32 includes a plurality of second sensing patterns 322 that are arranged in parallel with each other by extending from the second connection pattern 321 in a direction opposite to the first direction with the second connection pattern 321 that is formed linearly on the circuit board 3 in the second direction. In this case, the plurality of first sensing patterns 312 and the plurality of second sensing patterns 322 may be alternately arranged adjacent to each other.

In this case, the first connection pattern 311 and the second connection pattern 321 of the device for detecting a liquid 6 according to a modified example of the second example of the present disclosure may be formed to be exposed to the outside of the circuit board 3, which is different from the second example of the present disclosure.

Hereinafter, the principle of detecting a liquid of the device for detecting a liquid 6 according to the first and second examples of the present disclosure will be described with reference to FIGS. 7 and 8. In this case, FIG. 7 is a diagram illustrating the circuit diagrams of a first electrode and a second electrode of the device for detecting a liquid according to the first and second examples of the present disclosure, and FIG. 8 is a diagram illustrating other circuit diagrams of a first electrode and a second electrode of the device for detecting a liquid according to the first and second examples of the present disclosure.

Figure 7:
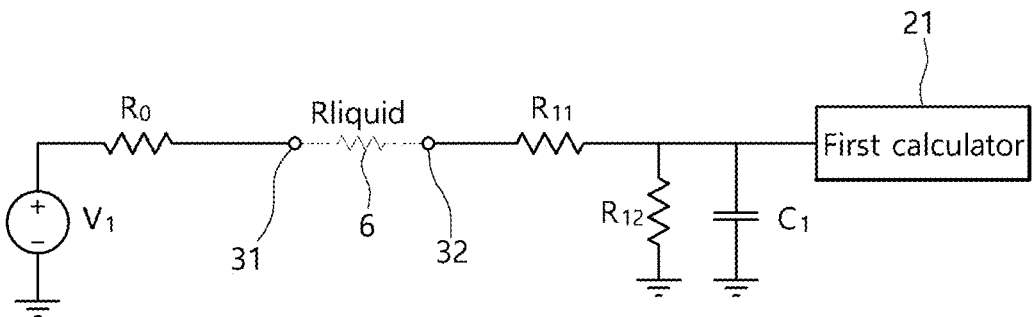
FIG. 7 is a diagram illustrating the circuit diagrams of a first electrode and a second electrode of the device for detecting a liquid according to the first and second examples of the present disclosure.
Figure 8:
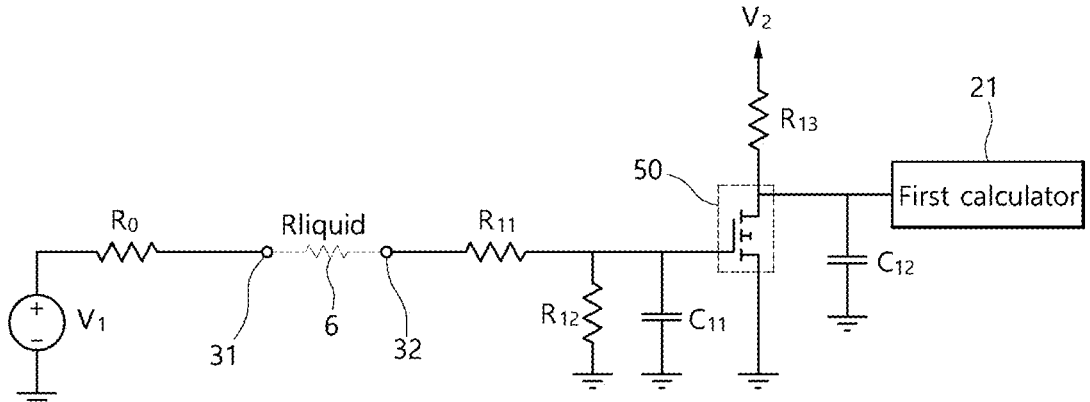
FIG. 8 is a diagram illustrating other circuit diagrams of a first electrode and a second electrode of the device for detecting a liquid according to the first and second examples of the present disclosure.

Referring to FIG. 7, R0 is the self-resistance of the first electrode 31, R11 is the self-resistance of the second electrode 32, and Rliquid is the self-resistance of the liquid 6 introduced into the housing 2 resistance, and R12 is a resistance connected to a first calculator 21 in order to sense a change in resistance due to the liquid 6 introduced into the housing 2 through a voltage distributed to R12.

In this case, as shown in FIG. 7, C1 may be connected in parallel to R12 such that noise is removed when the voltage applied to R12 is measured. However, since the method of connecting a capacitor to remove noise during voltage measurement is well known, the detailed description thereof will be omitted.

When the liquid 6 is not introduced into the housing 2, the first calculator 21 cannot detect a change in the voltage applied to R12. Accordingly, the electronic controller 20 operates normally. On the other hand, when the liquid 6 having self-resistance Rliquid is introduced into the housing 2, the first electrode 31 and the second electrode 32 are energized, and the first calculates 21 measures a voltage of the magnitude of $V\_1 \times R\_12/(R\_12+R\_0+R\_11+R\_liquid)$ applied to R12 according to the voltage distribution principle. Accordingly, the electronic controller 20 cuts off the supplied power 4.

In this case, since the Rliquid value changes according to the amount of the liquid 6 introduced into the housing 2 or the position of the liquid 6', the first calculator 21 can measure the continuous voltage change. Therefore, the electronic controller 20 may determine whether to cut off a power source 4 step by step based on the self-resistance Rliquid of the liquid 6 according to the introduced amount of the liquid 6 in which the failure of the electronic control device may occur.

However, when designed as a miniaturized integrated circuit, the self-resistance of the introduced liquid 6 may be relatively greater than the resistances of the first electrode 31 and the second electrode 32. Therefore, in this case, the voltage of the magnitude of $V\_1 \times R\_12/(R\_12+R\_0+R\_11+R\_liquid)$ applied to R12 approaches 0 according to the voltage distribution principle, and thus, there may be a problem in that it is difficult for the first calculator 21 to measure the change in voltage.

As described above, when the device for detecting a liquid 6 is designed as a miniaturized integrated circuit, as shown in FIG. 8, the first calculator 21 may further include a third switch 50 in order to determine only whether a voltage change occurs without measuring the continuous voltage change.

Referring to FIG. 8, the inflow of the liquid 6 causes a voltage of the magnitude of $V\_1 \times R\_12/(R\_12+R\_0+R\_11+R\_liquid)$ to be applied to R12 according to the voltage distribution principle, and as current flows by the third switch 50, the first calculator 21 may detect a voltage change.

In this case, the third switch 50 may be a semiconductor device for power, for example, a transistor. That is, when the third switch 50 flows a current between the first electrode 31 and the second electrode 32 by the self-resistance Rliquid of the liquid 6 introduced into the housing 2, there is no limitation in the examples as long as it is an element that allows the current to flow to the first calculator 21.

In this case, as shown in FIG. 8, C11 may be connected in parallel to R12 such that noise is removed when the voltage applied to R12 is measured, and C12 may be connected to R13 such that noise is removed when the voltage applied to R13 is measured. However, since the method of connecting a capacitor to remove noise during voltage measurement is well known, the detailed description thereof will be omitted. Meanwhile, referring to FIGS. 9 to 11, the device for detecting a liquid 6 according to a third example of the present disclosure may further include a third electrode 33 including a third connection pattern 331 and a plurality of third sensing patterns 332 and a second calculator 22.

Figure 9:
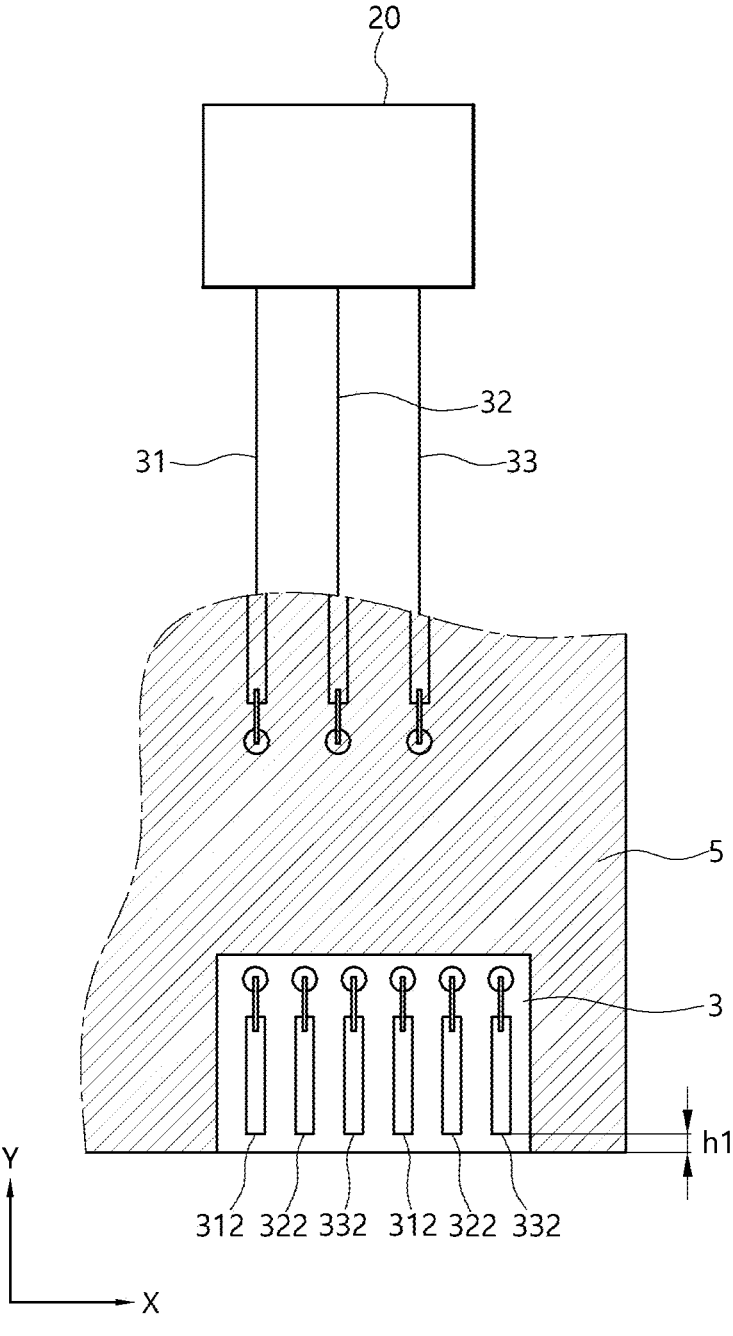
FIG. 9 is a plan view in which the first to third electrodes of the device for detecting a liquid according to a third example of the present disclosure are disposed on a circuit board.
Figure 10:
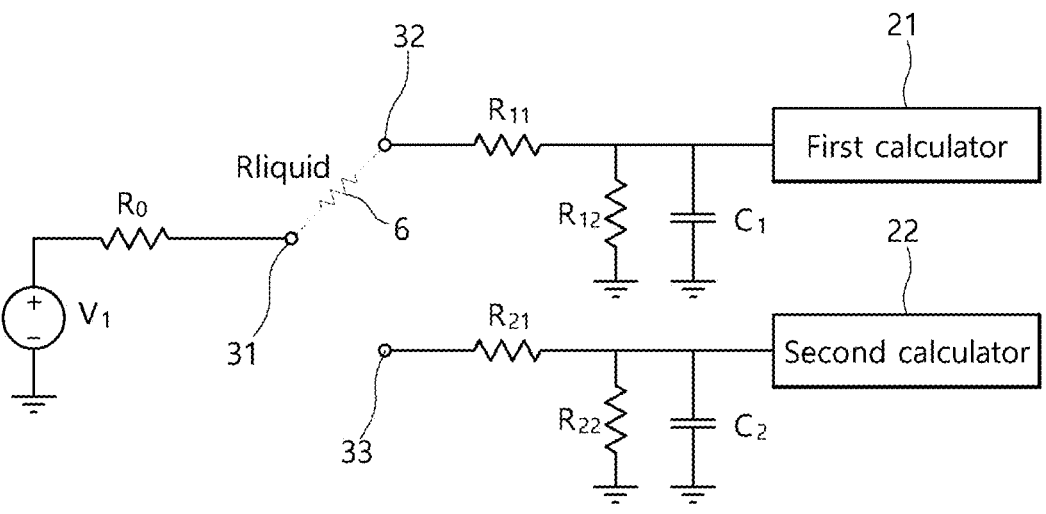
FIG. 10 is a diagram illustrating the circuit diagrams of a first electrode to a third electrode of the device for detecting a liquid according to the third example of the present disclosure.
Figure 11:
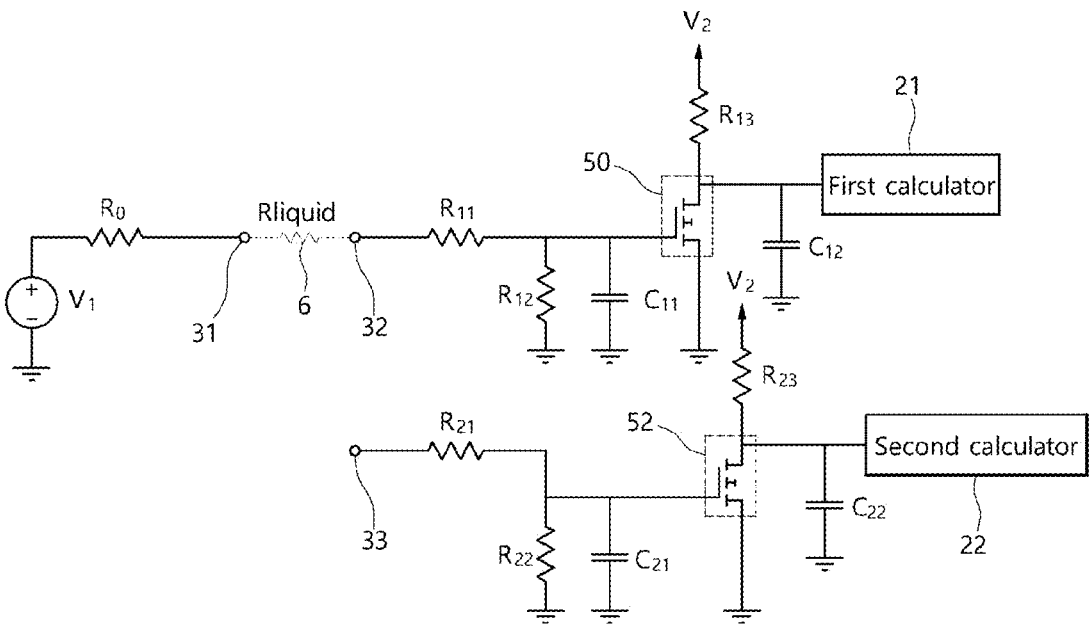
FIG. 11 is a diagram illustrating other circuit diagrams of a first electrode to a third electrode of the device for detecting a liquid according to the third example of the present disclosure.

Meanwhile, referring to FIGS. 9 to 11, the device for detecting a liquid 1 according to a third example of the present disclosure may further include a third electrode 33 including a third connection pattern 331 and a plurality of third sensing patterns 332 and a second calculator 22.

FIG. 9 is a plan view in which the first to third electrodes of the device for detecting a liquid according to a third example of the present disclosure are disposed on a circuit board, FIG. 10 is a diagram illustrating the circuit diagrams of a first electrode to a third electrode of the device for detecting a liquid according to the third example of the present disclosure, and FIG. 11 is a diagram illustrating other circuit diagrams of a first electrode to a third electrode of the device for detecting a liquid according to the third example of the present disclosure.

In this case, as shown in FIG. 9, the third connection pattern 331 is linearly formed on the circuit board 3 in the second direction parallel to the first connection pattern 311 and the second connection pattern 321. The plurality of third sensing patterns 332 extend parallel to the first sensing pattern 312 and the second sensing pattern 322 in a first direction perpendicular to the extending direction of the linearly formed third connection pattern 331. In this case, the first sensing pattern 312, the second sensing pattern 322 and the third sensing pattern 332 are alternately arranged, that is, alternately and repeatedly arranged in order.

In this case, in order to calculate the resistance formed between the first sensing pattern 312 and the third sensing pattern 332, the first electrode 31 and the third electrode 33 are connected to the second calculator 22. By including the second calculator 22, the electronic controller 20 may compare the value measured by the first calculator 21 with the value measured by the second calculator 22 to determine whether the liquid 6 has been introduced.

In more detail, when the resistance change is measured by the first calculator 21, in order to determine whether such a measured value is measured due to an error occurring in the first calculator 21, the electronic controller 20 compares the measured value with the value measured by the second calculator 22 to cut off power when the same value is shown. Accordingly, it is possible to increase the reliability of the liquid 6 inflow detection of the device for detecting a liquid 6.

In addition, as shown in FIG. 9, even if the liquid 6 energizes the first electrode 31 and the second electrode 32 such that the first calculator 21 normally detects a change in resistance, when the change in resistance is not detected in the second calculator 22, the electronic controller 20 determines that the amount of the introduced liquid 6 does not reach an amount sufficient to damage the electronic control device, and thus, the power cut-off may be withheld. That is, the liquid 6' must energize all of the first electrode 31 and the second electrode 32, and the first electrode 31 and the third electrode 33, and then, the electronic controller 20 will cut off the power.

In this case, the circuit of the third electrode 33 may be designed such that the second calculator 22 measures a continuous resistance change value as shown in FIG. 10, and as shown in FIG. 11, the circuit may be designed to include a third switch 50 and a fourth switch 52 such that the second calculator 22 may determine whether the resistance is changed.

In this case, the fourth switch 52 may also be a semiconductor device for power, for example, a transistor, like the third switch 50. That is, when the fourth switch 52 flows the current between the first electrode 31 and the third electrode 33 due to the self-resistance Rliquid of the liquid 6 introduced into the housing 2, there is no limitation in the examples as long as it is an element that flows the current to the second calculator 22.

In this case, since the principle that the second calculator 22 according to the circuit diagrams of FIGS. 10 and 11 detects a change in resistance between the first electrode 31 and the third electrode 33 is identical to the principle of detecting a resistance change between the first electrode 31 and the second electrode 32 by the first calculator 21, the description thereof will be omitted.

Hereinafter, various arrangements of the sensor 30 described above will be described with reference to FIGS. 12 to 14.

Figure 12:
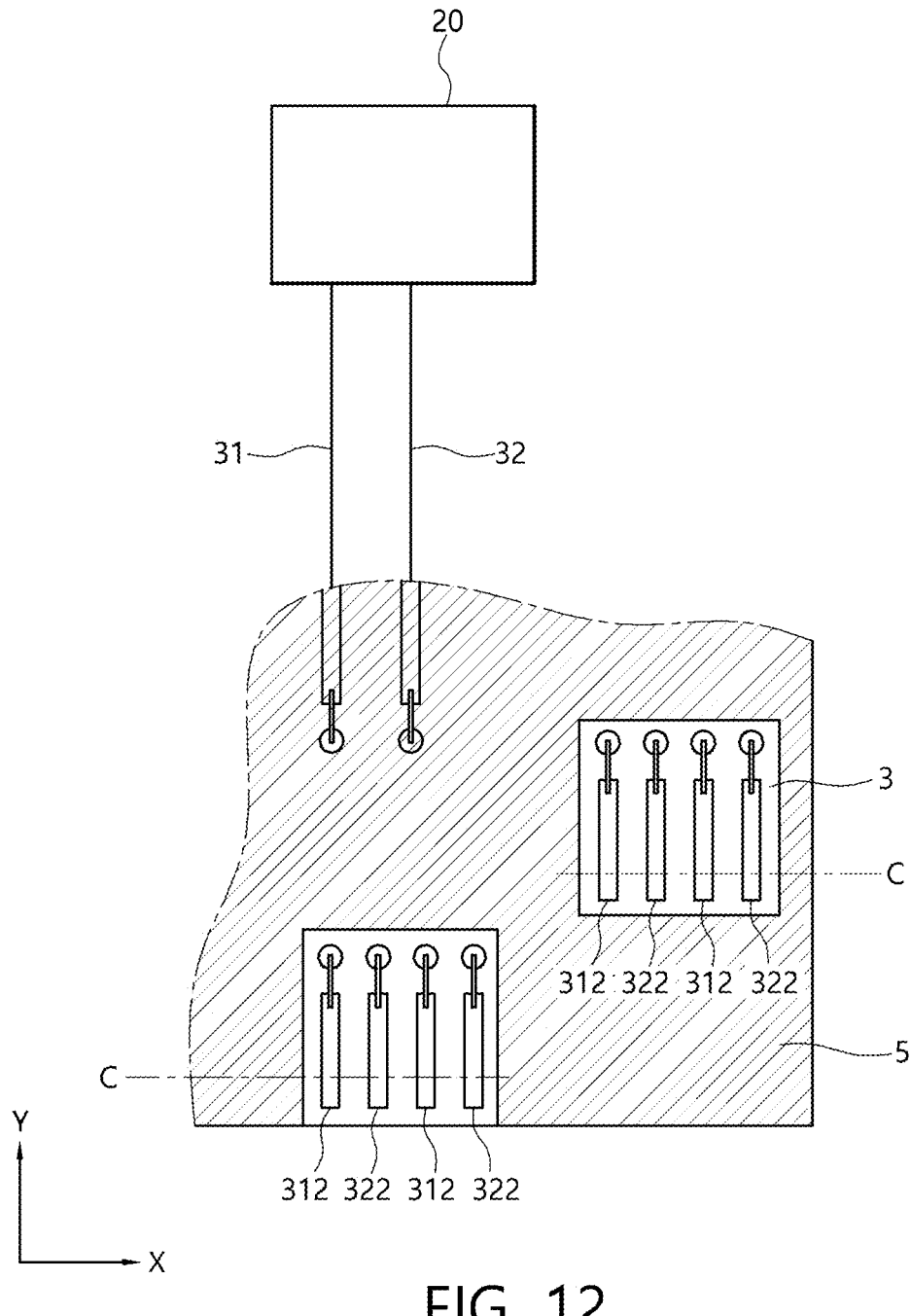
FIG. 12 is a plan view in which sensors of the device for detecting a liquid introduced into the housing of the device for detecting a liquid according to the second example of the present disclosure are connected in parallel.
Figure 13:
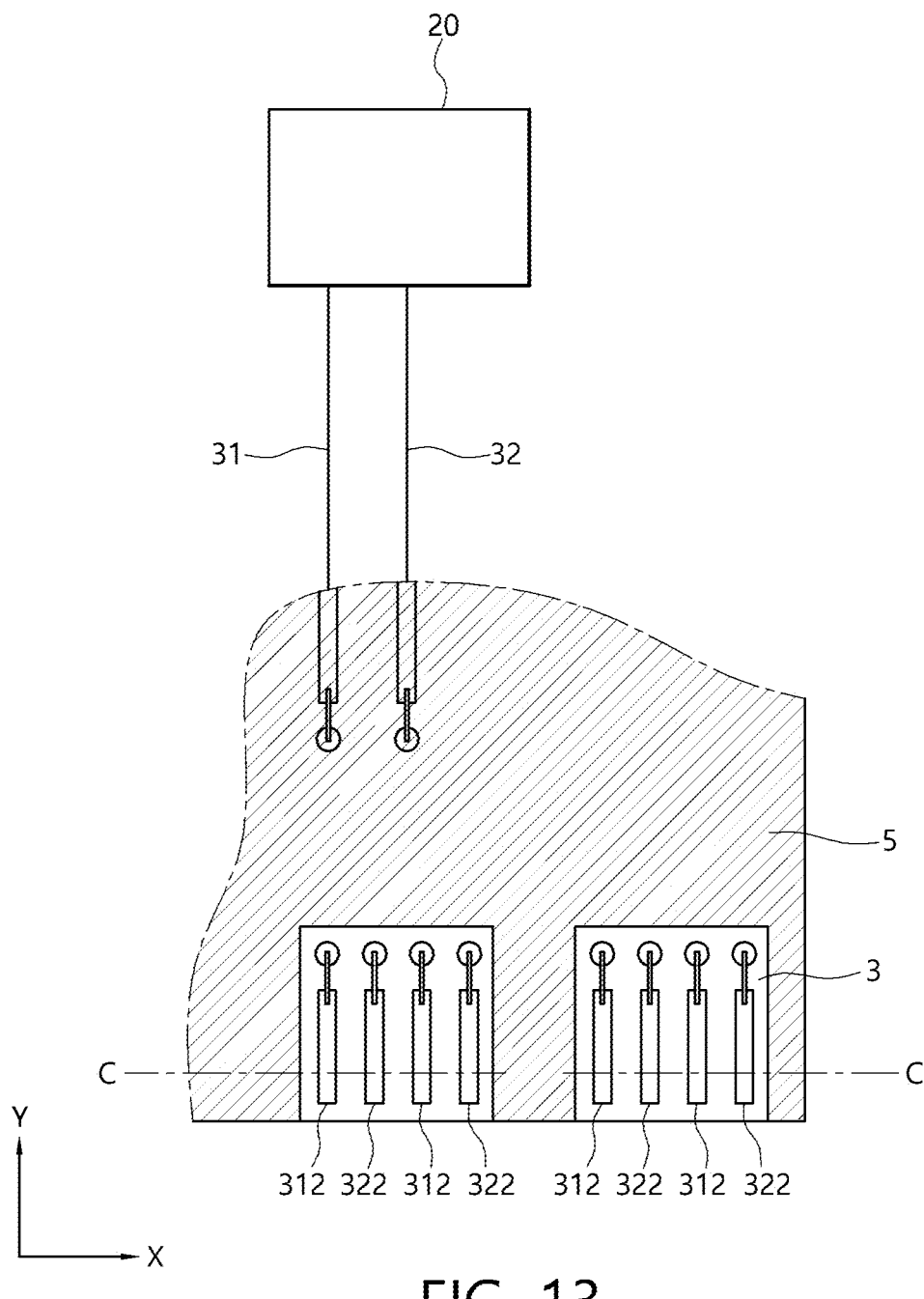
FIG. 13 is a plan view in which sensor of the device for detecting a liquid according to the second example of the present disclosure are arranged in a line.
Figure 14:
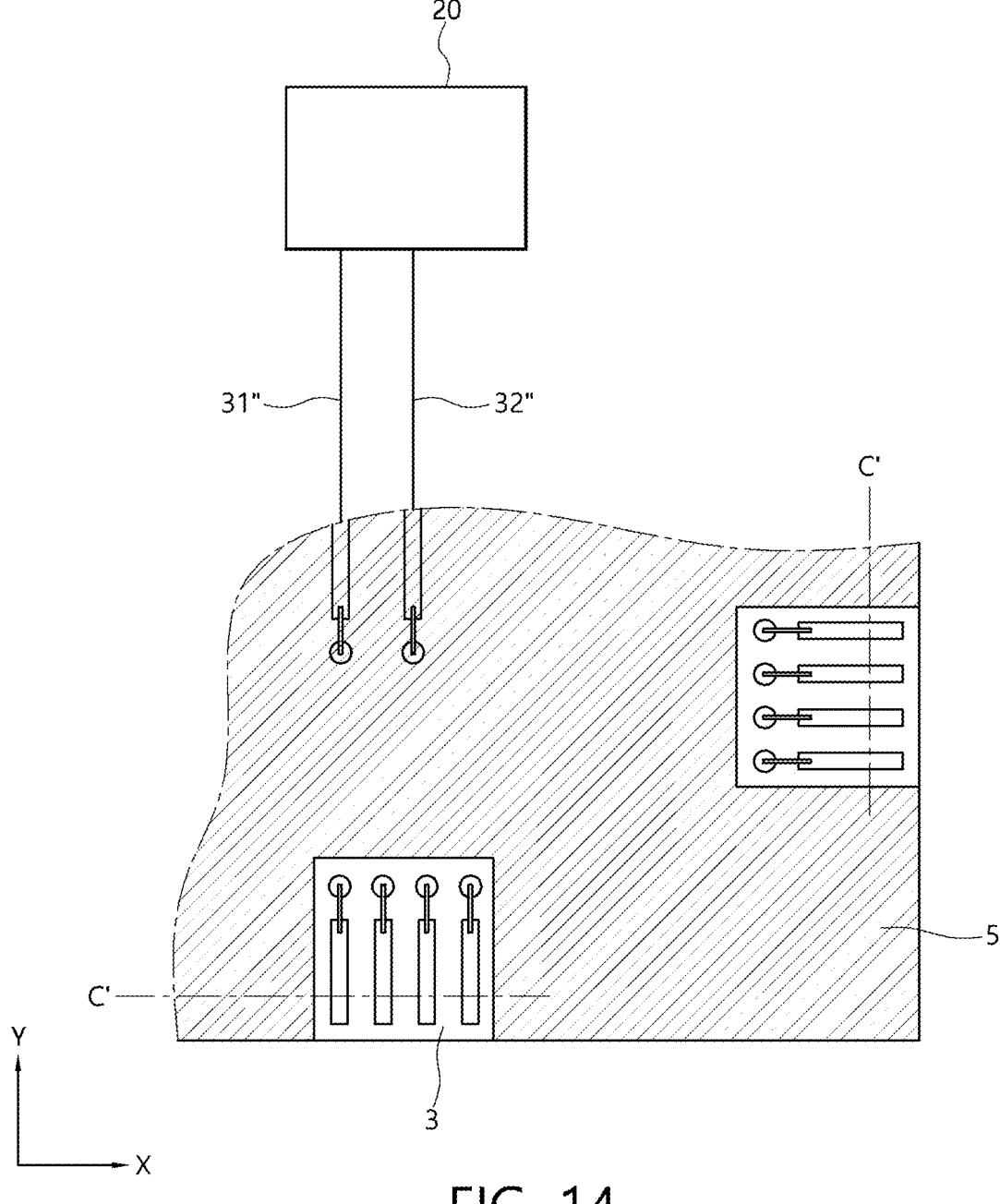
FIG. 14 is a plan view in which sensors for detecting liquid are vertically arranged according to the second example of the present disclosure.

In this case, FIG. 12 is a plan view in which sensors of the device for detecting a liquid introduced into the housing of the device for detecting a liquid according to the second example of the present disclosure are connected in parallel, FIG. 13 is a plan view in which sensor of the device for detecting a liquid according to the second example of the present disclosure are arranged in a line, and FIG. 14 is a plan view in which sensors for detecting liquid are vertically arranged according to the second example of the present disclosure.

Referring to FIGS. 12 to 14, the electronic controller 20 includes a first calculator 21, and when the liquid 6 introduced into the housing 2 is located between a plurality of first sensing patterns 312, 312', 312" and a plurality of second sensing patterns 322, 322', 322", it calculates the resistance caused by energization between the plurality of first sensing patterns 312, 312', 312" and the plurality of second sensing patterns 322, 322', 322".

Meanwhile, the device for detecting a liquid 6 according to the third example of the present disclosure may include the first calculator 21 in a main electronic controller 24.

In this case, referring to FIG. 12, a pair of sensors 30 including a first electrode 31 and a second electrode 32 as a pair are connected to the first calculator 21 in parallel.

Through this, even a single calculator has the effect of blocking the power by detecting the liquid 6 introduced into various places.

In addition, the sensors 30 formed in various places on the circuit board 3 are not limited to a pair, and at least two or more sensors 30 may be connected in parallel to the first calculator 21 of the electronic controller 20. At least two or more sensors 30 are formed on the circuit board 3 such that the liquid 6 introduced into the housing 2 is detected by another sensor 30 even if it is not detected by a specific sensor 30, and thus, the electronic controller 20 may cut off the power supply.

In particular, according to the second example of the present disclosure with reference to FIG. 12, when the central axis (C) of the sensor 30 is arranged for each layer in a direction of the electronic controller 20 from the outside, as the liquid 6 introduced into the housing 2 reaches the electronic controller 20 step by step, the electronic controller 20 may control whether to cut off the power. This is to prevent an accident from occurring due to an unexpected malfunction of the mechanical device used by the user by detecting the liquid 6 and immediately shutting off the power source 4.

Furthermore, when two or more sensors 30 formed at different positions are formed, when the resistance detected by the sensors 30 that are sequentially located according to the direction in which the liquid 6 introduced into the housing 2 flows toward the electronic controller 20 exceeds a set value, the electronic controller 20 may warn the user step by step through an alarm unit (not illustrated) and then cut off the power source 4.

Referring to FIG. 13, according to a modified example of the second example of the present disclosure, the sensors 30' connected to the electronic controller 20 are arranged in a line on the circuit board 3. Herein, that the sensors 30' are arranged in a line means that the extension line of the central axis (C') of one sensor 30' on the circuit board 3 is placed to coincide with the central axis (C') of another sensor 30'.

Since the sensors 30' are arranged in a line on the circuit board 3, there is an advantage that the liquid 6 introduced into the housing 2 may be detected even if it flows through various paths from one corner. In particular, when the housing 2 is manufactured in an assemblable form, it is preferable to arrange in a line at the corner by the length of the assembly space (not illustrated).

According to another modified example of the second example of the present disclosure with reference to FIG. 14, the sensors 30" connected to the electronic controller 20 are vertically arranged on the circuit board 3. Herein, that the sensors 30" are vertically arranged means that the central axis (C') of one sensor 30" is arranged perpendicular to the central axis (C") of another sensor 30" on the circuit board 3.

By arranging the sensors 30" vertically on the circuit board 3, there is an advantage of being able to detect the liquid 6 introduced into the housing 2 flowing into various paths in the same manner as the sensors 30" being arranged in a line. In particular, when the housing 2 is assembled and manufactured in an angular shape, it is advantageous to vertically arrange the sensors 30 to detect the inflow of the liquid 6.

In this case, the sensors 30 connected in parallel to the electronic controller 20 may be connected in parallel to the first calculator 21 of the electronic controller 20, but also may be connected to calculators that are individually present for each sensor 30. When connected to the first calculator 21 in parallel, one calculator may process the contents sensed by the sensors 30 at various locations, thereby reducing the manufacturing cost of the electronic controller 20, but this is because when one first calculator 21 fails, there is a problem in that it is difficult to control the power source 4.

Hereinafter, the sensor 30 exhibiting the effect of using the two sensors 30 by adding a third electrode 33 will be described with reference to FIG. 15. In this case, FIG. 15 is a plan view in which the first electrode 31 to the third electrode 33 of the device for detecting a liquid according to the fourth example of the present disclosure are disposed on a circuit board.

Figure 15:
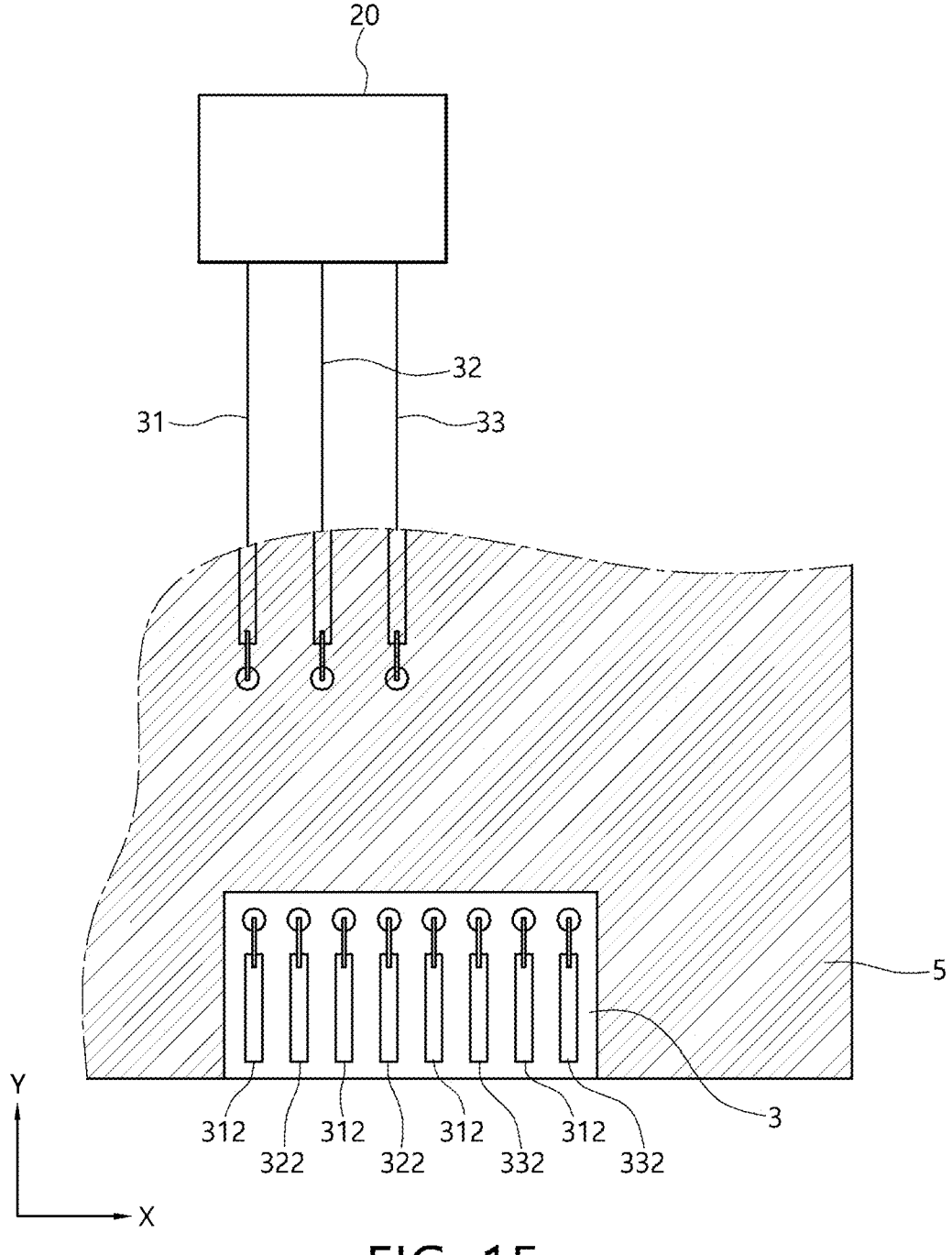
FIG. 15 is a plan view in which the first to third electrodes of the device for detecting a liquid according to a fourth example of the present disclosure are disposed on a circuit board.

With reference to FIGS. 2 and 15, the device for detecting a liquid according to the fourth example of the present disclosure includes a second calculator 22 and is formed in a comb pattern and includes a second electrode 32 and a third electrode 33 that share the first electrode 31.

Meanwhile, the device for detecting a liquid 6 according to the fourth example of the present disclosure may include the first calculator 21 and the second calculator 22 in the main electronic controller 24.

In this case, the first electrode 31 to the third electrode 33 formed in a comb pattern will be described in more detail as follows. The first electrode 31 includes a first connection pattern 311 that is linearly formed on the circuit board 3 in the second direction, and a plurality of first sensing patterns 312 that extend from the first connection pattern 311 in the first direction and are arranged parallel to each other. The second electrode 32 includes a second connection pattern 321 that is linearly formed on the circuit board 3 in the second direction, and a plurality of second sensing patterns 322 that extend from the second connection pattern 321 in the first direction and are arranged parallel to each other. The third electrode 33 includes a third connection pattern 331 that is linearly formed on the circuit board 3 in the second direction, and a plurality of third sensing patterns that extend from the third connection pattern 331 in the first direction and are arranged parallel to each other.

In this case, some of the plurality of first sensing patterns 312 and the plurality of second sensing patterns 322 are alternately arranged, that is, arranged alternately adjacent to each other in the order of the first sensing patterns 312 and the second sensing patterns 322. In addition, the remainder of the first sensing patterns 312 and the third sensing patterns 332 are alternately arranged like the first sensing patterns 312 and the second sensing patterns 322. This pattern has the effect of adding one more sensor 30 by adding one electrode even if the sensor 30 is not added.

Referring to FIG. 15, the first electrode 31 and the second electrode 32 are connected to the first calculator 21 of the electronic controller 20, and the first calculator 21 conducts electricity by placing the liquid 6 between the first sensing pattern 312 of the first electrode 31 and the second sensing pattern 322 of the second electrode 32 to calculate the resistance occurring. Similarly, the first electrode 31 and the third electrode 33 are connected to the second calculator 22 of the electronic controller 20, and the second calculator 22 conducts electricity by placing the liquid between the first sensing pattern 312 of the first electrode and the third sensing pattern 332 of the third electrode 33 to calculate the resistance occurring.

Hereinafter, with reference to FIG. 16, the case in which the sensor 30 detects that an electrical short occurs due to the introduction of a liquid into the housing 2 of the electronic controller 20 will be described in stages.

Figure 16:
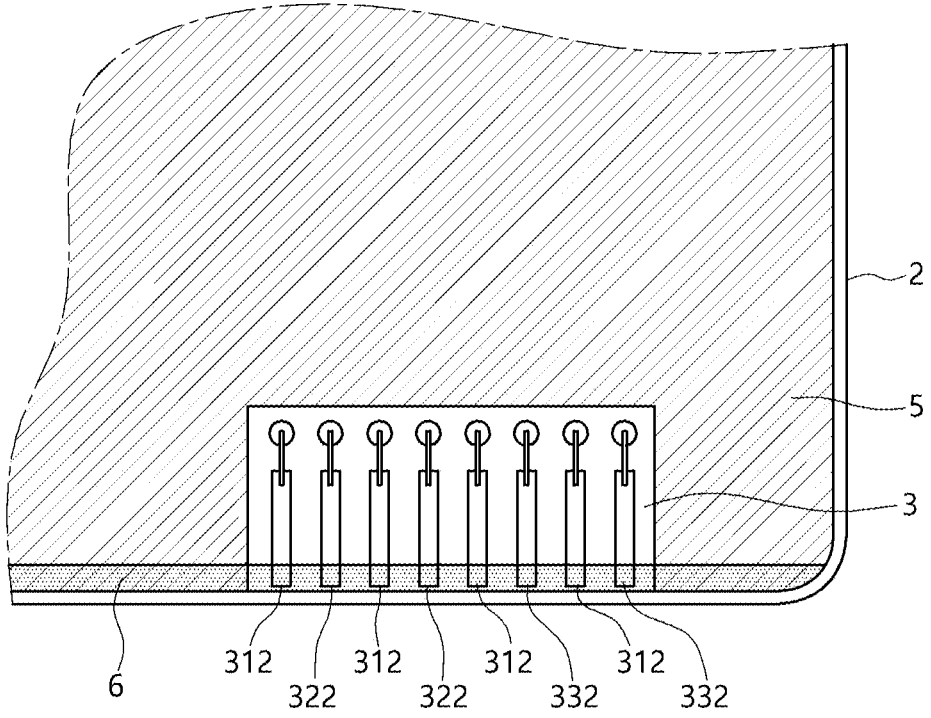
FIG. 16 is a diagram schematically illustrating a liquid inflow state of the device for detecting a liquid according to the second example of the present disclosure.

FIG. 16 is a diagram schematically illustrating a liquid inflow state of the device for detecting a liquid introduced into a housing of an electronic control device according to the second example of the present disclosure.

Referring to FIG. 16, in the device for detecting a liquid according to the second example of the present disclosure, the circuit board 3 is fixed inside the housing 2 to be parallel to the direction of gravity, and the sensor 30 is mounted on the circuit board 3 at the lower edge. In this case, it is not necessary to arrange only one sensor 30, and two or more sensors 30 may be arranged for each layer. In addition, the sensor 30 may be additionally disposed in the direction in which the liquid directly permeates.

In this case, when the oil or moisture leaked from a hydraulic cylinder (not illustrated) reaches the housing 2, the liquid 6 is introduced into the housing 2 as if it permeates into an opening/closing part (not illustrated) for opening the housing 2 or an assembly space (not illustrated).

Therefore, as shown in FIG. 16, the liquid 6 introduced into the housing 2 receives gravity and accumulates in a lower portion of the housing 2, and before the liquid 6 reaches the electronic controller 20, the sensor 30 detects the liquid 6.

When the sensor 30 detects the liquid 6, the electronic controller 20 cuts off the power supplied from the power source 4. In this case, when two or more sensors 30 are disposed and the sensor 30 installed far from the electronic controller 20 detects a liquid inflow, the electronic controller 20 notifies the user through an alarm unit (not illustrated). Afterwards, when the sensor 30 adjacent to the electronic controller 20 detects a liquid inflow, the electronic controller 20 cuts off the power supplied from the power source 4.

Although the device for detecting a liquid according to various examples of the present disclosure has been described above, the electronic control device according to the present example is not only applicable to the brake system of a vehicle, and when electronic components are installed inside the housing, those of ordinary skill in the art to which the present disclosure pertains will clearly understand that it may be used as the device for detecting a liquid for protecting electronic components inside the housing placed in a state where liquid can be easily introduced into the housing due to the external environment of the housing.

As described above, preferred exemplary embodiments according to the present disclosure have been reviewed, and the fact that the present disclosure can be embodied in other specific forms without departing from the spirit or scope of the present disclosure in addition to the above-described exemplary embodiments will be apparent to those of ordinary skill in the art. Therefore, the above-described exemplary embodiments are to be regarded as illustrative rather than restrictive, and accordingly, the present disclosure is not limited to the above description, but may be modified within the scope of the appended claims and their equivalents.

The invention claimed is:

1. A device for detecting a liquid introduced into a housing of an electronic control device, which comprises a housing, a circuit board installed in the housing and an electronic controller mounted on one side of the circuit board and connected to an operator located outside the housing to control the operator, the device comprising:

a sensor which is formed on the other side of the circuit board; and a first switch for cutting off power supplied to the electronic controller from a power source, wherein the sensor comprises a first electrode which is formed on the circuit board and connected a ground and a second electrode which is spaced apart from the first electrode by a predetermined distance and connected to a first calculator, wherein the first electrode comprises a linear first sensing pattern extending in a first direction, wherein the second electrode comprises a linear second sensing pattern extending in the first direction, wherein the first sensing pattern and the second sensing pattern are arranged in parallel, and wherein the electronic controller comprises the first calculator for calculating a resistance formed between the first sensing pattern and the second sensing pattern by a liquid introduced into the housing, and operates the first switch according to a value measured by the first calculator to cut off the supplied power, wherein the first sensing pattern is formed as a plurality of first sensing patterns arranged parallel to each other, the second sensing pattern is formed as a plurality of second sensing patterns arranged parallel to each other and the plurality of first sensing patterns and the plurality of second sensing patterns are alternately disposed, wherein the plurality of first sensing patterns and the plurality of second sensing patterns are formed to extend toward an edge of the circuit board and are arranged to have a preset distance from the edge of the circuit board.

2. The device of claim 1, wherein the first direction is a direction extending along an edge of the circuit board.

3. The device of claim 2, further comprising:

a third electrode which is formed on a side of the second electrode, wherein the third electrode comprises a linear third sensing pattern extending in the first direction, wherein the first sensing pattern, the second sensing pattern and the third sensing pattern are arranged in parallel, and wherein the electronic controller further comprises a second calculator for calculating a resistance formed between the first sensing pattern and the third sensing pattern.

4. The device of claim 3, wherein the third electrode further comprises a third connection pattern extending in a second direction, and wherein the third sensing pattern extends from the third connection pattern in the first direction.

5. The device of claim 1, wherein the first direction is a direction perpendicular to a direction extending along an edge of the circuit board.

6. The device of claim 1, wherein the electronic controller operates the first switch to cut off the supplied power, when the first calculator measures a resistance formed between the first sensing pattern and the second sending pattern.

7. The device of claim 1, wherein the electronic controller operates the first switch to cut off the supplied power, when the resistance formed between the first sensing pattern and the second sensing pattern measured by the first calculator exceeds a predetermined value.

8. The device of claim 1, further comprising:

a third electrode which is formed on a side of the second electrode and connected to a second calculator, wherein the third electrode comprises a third sensing pattern formed as a plurality of third sensing patterns extending in the first direction and arranged parallel to each other, wherein the electronic controller further comprises the second calculator for calculating a resistance formed between the third sensing pattern and the first sensing pattern, wherein the plurality of first sensing patterns is divided into a first group and a second group, wherein the first group of the plurality of first sensing patterns is arranged to alternate with the plurality of second sensing patterns, and wherein the second group of the plurality of first sensing patterns is arranged to alternate with the plurality of third sensing patterns.

9. The device of claim 1, further comprising:

a third electrode which is formed on a side of the second electrode, wherein the third electrode comprises:

a third connection pattern extending in a second direction; and a plurality of third sensing patterns extending in the first direction from the third connection pattern and arranged parallel to each other, wherein the plurality of the third sensing patterns are arranged to alternate with the plurality of the first sensing patterns and the plurality of the second sensing patterns in order, and wherein the electronic controller further comprises a second calculator for calculating a resistance formed between the third sensing pattern and the first sensing pattern.

10. The device of claim 9, wherein the electronic controller measures a resistance formed between the first sensing pattern and the second sensing pattern by the first calculator, and measures a resistance formed between the third sensing pattern and the first sensing pattern by the second calculator.

11. The device of claim 10, wherein the electronic controller operates the first switch to cut off the supplied power, when the resistance formed between the first sensing pattern and the second sensing pattern measured by the first calculator exceeds a predetermined value, or the resistance formed between the third sensing pattern and the first sensing pattern measured by the second calculator exceeds a predetermined value.

12. The device of claim 1, wherein the first electrode and the second electrode are connected in parallel to each other.

13. The device of claim 1, wherein the first electrode and the second electrode are arranged in a line with each other.

14. The device of claim 1, wherein the sensor is formed on a periphery or corner of the circuit board.

15. The device of claim 1, wherein the sensor is formed in plurality, and wherein a plurality of the sensors are formed at different positions on the circuit board.

16. The device of claim 1, wherein the electronic controller comprises:

a main electronic controller;

an operator controller for receiving a signal from the main electronic controller to control an operator; and a second switch for cutting off power supplied from the power source to the operator controller, and wherein the main electronic controller determines whether a liquid is introduced into the housing through a resistance change of the sensor and operates the second switch to cut off power supplied to the operator controller.

17. The device of claim 1, wherein the circuit board is disposed inside the housing such that the sensor is formed at a lower end of the circuit board in the gravity direction.

18. The device of claim 17, wherein the circuit board is installed inside the housing so as to be parallel to the gravity direction.

19. The device of claim 1, wherein the housing comprises a first housing and a second housing coupled to the first housing to form a space therein, wherein the circuit board is disposed inside the first housing and the second housing such that the sensor is adjacent to an edge in which the first housing and the second housing come into contact with each other.

20. The device of claim 1, wherein the operator is a brake system of a vehicle that is controlled by using brake oil, and wherein the liquid is the brake oil leaked from a brake system of the vehicle and introduced into the housing.

21. The device of claim 20, wherein the brake system of the vehicle comprises:

a reservoir in which the brake oil is stored;

a valve block having the reservoir connected to one side and having at least one flow path formed therein such that the brake oil moves; and at least one solenoid valve for opening and closing the flow path formed in the valve block, wherein the housing is fixed to the other side of the valve block, and wherein the electronic controller controls the opening and closing of the solenoid valve.

22. The device of claim 21, wherein the sensor is disposed on one surface of the circuit board on a side on which the valve block is disposed.

\*　\*　\*　\*　\*